(12) United States Patent
Jang et al.

(10) Patent No.: US 7,834,374 B2
(45) Date of Patent: Nov. 16, 2010

(54) LIGHT EMITTING DIODE HAVING VERTICAL TOPOLOGY AND METHOD OF MAKING THE SAME

(75) Inventors: Jun Ho Jang, Anyang-si (KR); Jae Wan Choi, Seoul (KR); Duk Kyu Bae, Seoul (KR); Hyun Kyong Cho, Seoul (KR); Jong Kook Park, Centreville, VA (US); Sun Jung Kim, Suwon-si (KR); Jeong Soo Lee, Seongnam-si (KR)

(73) Assignees: LG Electronics Inc., Seoul (KR); LG Innotek Co., Ltd., Seoul (KR)

( * ) Notice: Subject to any disclaimer, the term of this patent is extended or adjusted under 35 U.S.C. 154(b) by 255 days.

(21) Appl. No.: 11/708,133

(22) Filed: Feb. 20, 2007

(65) Prior Publication Data
US 2007/0295952 A1 Dec. 27, 2007

(30) Foreign Application Priority Data
Jun. 23, 2006 (KR) ............... 10-2006-0057033
Sep. 26, 2006 (KR) ............... 10-2006-0093465
Sep. 26, 2006 (KR) ............... 10-2006-0093574

(51) Int. Cl.
*H01L 33/40* (2010.01)
*H01L 33/44* (2010.01)

(52) U.S. Cl. ............... 257/99; 257/96; 257/E33.063; 257/E33.068; 257/E33.067

(58) Field of Classification Search ............... 257/79, 257/94, 95, 96, 97, 98, 99, 100, E33.064, 257/E33.067, E33.074, E33.063, E33.068
See application file for complete search history.

(56) References Cited

U.S. PATENT DOCUMENTS 5,453,386 A  9/1995 Holm et al.
5,779,924 A * 7/1998 Krames et al. ............... 216/24
6,197,609 B1 * 3/2001 Tsutsui et al. ............... 438/33
6,573,537 B1  6/2003 Steigerwald et al.
6,831,302 B2 * 12/2004 Erchak et al. ............... 257/87
6,869,820 B2  3/2005 Chen (Continued)

FOREIGN PATENT DOCUMENTS

CN   1790757   6/2006

(Continued)

OTHER PUBLICATIONS

International Search Report dated Jan. 26, 2007.

*Primary Examiner*—Victor A Mandala
*Assistant Examiner*—Scott Stowe
(74) *Attorney, Agent, or Firm*—McKenna Long & Aldridge LLP

(57) ABSTRACT

An LED having vertical topology and a method of making the same is capable of improving a luminous efficiency and reliability, and is also capable of achieving mass productivity. The method includes forming a semiconductor layer on a substrate; forming a first electrode on the semiconductor layer; forming a supporting layer on the first electrode; generating an acoustic stress wave at the interface between the substrate and semiconductor layer, thereby separating the substrate from the semiconductor layer; and forming a second electrode on the semiconductor layer exposed by the separation of the substrate.

33 Claims, 36 Drawing Sheets

U.S. PATENT DOCUMENTS

| | | |
|---|---|---|
| 6,933,160 B2 | 8/2005 | Hon |
| 6,995,032 B2 | 2/2006 | Bruhns et al. |
| 7,037,742 B2 | 5/2006 | Slater, Jr. et al. |
| 2003/0141507 A1 | 7/2003 | Krames et al. |
| 2004/0235210 A1 | 11/2004 | Tamura et al. |
| 2004/0262621 A1 | 12/2004 | Oh et al. |
| 2005/0221527 A1 | 10/2005 | Yeh et al. |
| 2005/0227455 A1 | 10/2005 | Park et al. |
| 2005/0242365 A1* | 11/2005 | Yoo .......................... 257/103 |
| 2006/0065905 A1* | 3/2006 | Eisert et al. .................. 257/95 |
| 2006/0071230 A1 | 4/2006 | Lee et al. |
| 2006/0081869 A1* | 4/2006 | Lu et al. ...................... 257/99 |
| 2006/0091409 A1 | 5/2006 | Epler et al. |
| 2006/0097274 A1 | 5/2006 | Lee et al. |
| 2006/0151801 A1* | 7/2006 | Doan et al. .................. 257/99 |

FOREIGN PATENT DOCUMENTS

| | | |
|---|---|---|
| JP | 8-167735 | 6/1996 |
| KR | 0504178 | 7/2005 |
| WO | WO 2006/011672 | 2/2006 |

* cited by examiner

US 7,834,374 B2

LIGHT EMITTING DIODE HAVING VERTICAL TOPOLOGY AND METHOD OF MAKING THE SAME

This application claims the benefit of Korean Patent Application No. 10-2006-0057033, filed on Jun. 23, 2006, Korean Patent Application No. 10-2006-0093465, filed on Sep. 26, 2006, and Korean Patent Application No. 10-2006-0093574, filed on 2006, which are all hereby incorporated by reference as if fully set forth herein.

BACKGROUND OF THE INVENTION

1. Field of the Invention

The present invention relates to an LED having vertical topology, and more particularly, to an LED having vertical topology that is capable of achieving high luminous efficiency and reliability thereof, and is also capable of improving mass productivity, and a method of making the same.

2. Discussion of the Related Art

Light Emitting Diodes (LEDs) are well-known semiconductor light-emitting devices that convert electric current into light. They have been used as light sources for display image of electronic equipment including information communication equipment, since the commercialization of red LEDs using GaAsP semiconductors in 1962, and in conjunction with green GaP:N LEDs that became commercialized thereafter.

The wavelength of light emitted by such LEDs is dependent upon the kinds of the semiconductor materials that are used to manufacture of the LEDs. This is because the wavelength of emitted light is dependent upon the band-gap of the semiconductor materials that represent an energy difference between valence-band electrons and conduction band electrons.

Gallium nitride (GaN) has a high thermal stability and a broad band gap (ranging from 0.8 to 6.2 eV), and therefore has received a great deal of attention in the development of high-power output electronic component devices and LEDs.

In LEDs, another reason why gallium nitride has attracted a great deal of interest is because it is possible to fabricate semiconductor layers emitting green, blue and white light, by using GaN in combination with other elements such as indium (In), aluminum (Al) and the like.

Due to the capability of controlling an emission wavelength via the use of GaN, the emission wavelength may be adjusted based on the intrinsic properties of the materials used to comply with the characteristics of specific equipment. For example, the use of GaN makes it possible to manufacture blue LEDs, which are beneficial for optical writing, and white LEDs, which are capable of replacing incandescent lamps.

Due to various advantages of such GaN-based materials, the GaN-based LED market is rapidly growing. As a result, technologies of GaN-based optoelectronic devices have been rapidly advancing since its commercial introduction in 1994.

As such, the fabrication technology of LEDs utilizing Group III/V nitride semiconductor materials has achieved rapid development since the mid 1990's. In particular, owing to further advanced understanding of the growth methods and structures of the nitride semiconductor materials, significant improvements have been achieved in LED's characteristics such as brightness, output, driving voltage, and electrostatic properties, as well as reliability.

Despite the rapid advancement in technologies of GaN-based semiconductor devices, the fabrication of GaN-based devices suffers from a great disadvantage in terms of high-production costs. This disadvantage is closely related to difficulties associated with growing GaN epitaxial layers and subsequent cutting of finished GaN-based devices.

The GaN-based devices are generally fabricated on a sapphire substrate. This is because the sapphire substrate is commercially available in a size suited for the mass production of the GaN-based devices, supports a relatively high quality GaN epitaxial growth, and exhibits high processability in a wide range of temperatures.

Further, the sapphire substrate is chemically and thermally stable, and has a high-melting point, thus making it possible to perform a high-temperature manufacturing process, and has a high binding energy (122.4 Kcal/mole) as well as a high dielectric constant. In terms of its chemical structure, sapphire is crystalline aluminum oxide ($Al_2O_3$).

Meanwhile, because sapphire is an insulating material, the use of sapphire substrate (or any other insulating substrate) practically limits the LED device using the insulating substrate to a lateral structure.

In the lateral structure, all metal contacts used in injecting electric current into the LED are positioned on the top surface of the device structure (or on the same plane as the substrate).

In addition, as an available fabrication process of the LED device, a flip chip bonding method is widely employed that involves fabrication of an LED chip and reverse attachment of the resulting chip to a sub-mount such as a silicon wafer or ceramic substrate having excellent thermal conductivity.

However, the LED having the lateral structure or the LED fabricated using the flip chip method suffers from problems associated with poor heat release efficiency because the sapphire substrate has heat conductivity of about 27 W/mK, thus leading to very high heat resistance. Further, the flip chip method has additional disadvantages of requiring large numbers of photolithography process steps, thus resulting in complicated manufacturing processes.

On the other hand, the vertical structure is characterized in that the sapphire substrate is removed by the so-called laser lift-off (LLO) process, followed by fabrication of electrodes. In the vertical structure, one metal contact is positioned on the top surface and the other contact is positioned on the bottom surface of the device structure after removal of the sapphire (insulating) substrate.

Even though the laser lift-off process has advantages of remarkably reducing the number of the manufacturing process steps and providing excellent luminescence properties, such a conventional laser lift-off process damages the crystal structure of the LED due to thermal stress occurring between the sapphire substrate and LED structure when performing laser irradiation.

Further, nitrogen ($N_2$) gas, separated and discharged from Ga upon performing laser irradiation, passes through the LED structure, which leads to damage of the LED crystal structure, and thus significantly reduces production yield and consequently makes it difficult to realize mass production.

SUMMARY

Accordingly, a light emitting diode (LED) having vertical topology and a method of making the same that substantially obviates one or more problems due to limitations and disadvantages of the related art is disclosed.

An object of the present invention is to provide a method of making an LED having vertical topology that is capable of efficiently achieving substrate separation and is also capable of ensuring a structural stability of the device, in a separation process between a sapphire substrate and a GaN-based semiconductor layer, which is desired in the manufacture of an LED having a vertical structure. Therefore, the present invention may make a great contribution to structural characteristics and reliability of the semiconductor from which the substrate was separated, and may also remarkably improve a stable separation yield and thereby productivity.

Another object of the present invention is to provide an LED having vertical topology and method of making the same, which are not only capable of significantly improving a light-extraction efficiency and but are also capable of controlling luminescence properties and light patterns of a device, via the introduction of various structures for improving light-extraction.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method of making a light emitting diode (LED) includes forming a semiconductor layer on a substrate; forming a first electrode on the semiconductor layer; forming a supporting layer on the first electrode; generating an acoustic stress wave at the interface between the substrate and semiconductor layer, thereby separating the substrate from the semiconductor layer; and forming a second electrode on the semiconductor layer exposed by the separation of the substrate.

In another aspect of the present invention, a light emitting diode (LED) includes a plurality of semiconductor layers; a first electrode disposed on a first surface of the semiconductor layers; passivation layers disposed on at least a portion of the first electrode and on at least one surface of the semiconductor layers; at least one connection metal layer disposed on a portion or an entire portion of the first electrode and passivation layers; a second electrode formed on a second surface of the semiconductor layers; and a supporting layer disposed on the first electrode.

In a further aspect of the present invention, a light emitting diode (LED) includes a plurality of semiconductor layers; a first electrode disposed on a first surface of the semiconductor layers and includes at least two layers; a light-extraction structure formed on at least a portion of a second surface of the semiconductor layers; a second electrode disposed on the second surface of the semiconductor layers; and a supporting layer disposed on the first electrode.

In a still further aspect of the present invention, a light emitting diode (LED) includes a plurality of semiconductor layers; a transparent conductive oxide (TCO) layer disposed on a first surface of the semiconductor layers; a reflective electrode disposed on the TCO layer; a supporting layer disposed on the reflective electrode; and a second electrode disposed on a second surface of the semiconductor layers.

In yet another aspect of the present invention, a light emitting diode (LED) includes a plurality of semiconductor layers; passivation layers disposed on at least one surface of the semiconductor layers; a first electrode disposed on a portion or an entire portion of the semiconductor layers and passivation layers, being in ohmic contact with the semiconductor layers, and formed integrally with a seed metal layer for bonding to a metal or a semiconductor; a second electrode formed on a second surface of the semiconductor layers; and a supporting layer disposed on the first electrode.

It is to be understood that both the foregoing general description and the following detailed description are exemplary and explanatory and are not intended to limit the scope of the claims.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENTS

Figure 1:
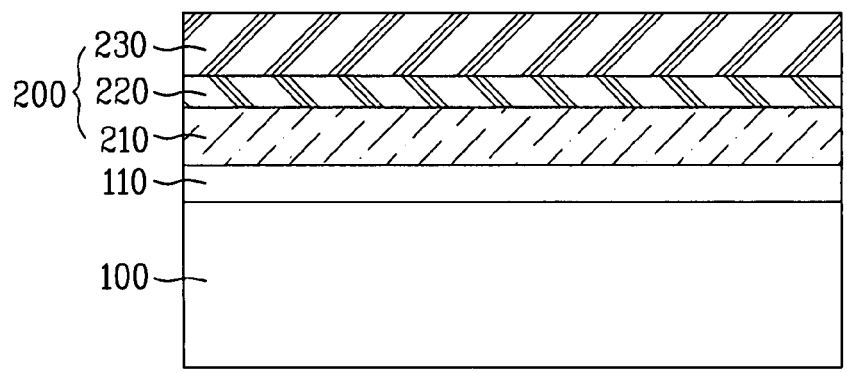
FIGS. 1 to 37 are cross-sectional views illustrating respective manufacturing steps of an LED having vertical topology according to a first embodiment of the present invention.

The present invention now will be described more fully hereinafter with reference to the accompanying figures, in which embodiments of the invention are shown. This invention may, however, be embodied in many alternate forms and should not be construed as limited to the embodiments set forth herein. Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims.

Like numbers refer to like elements throughout the description of the figures. In the drawings, the thickness of layers and regions are exaggerated for clarity.

It will be understood that when an element such as a layer, region or substrate is referred to as being "on" another element, it can be directly on the other element or intervening elements may also be present. It will also be understood that if part of an element, such as a surface, is referred to as "inner," it is farther to the outside of the device than other parts of the element.

It will be understood that these terms are intended to encompass different orientations of the device in addition to the orientation depicted in the figures. Finally, the term "directly" means that there are no intervening elements. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms.

Preferred embodiments of the present invention will be described, for example, with reference to a gallium nitride (GaN)-based light emitting diode (LED) formed on a non-conductive substrate such as a sapphire ($Al_2O_3$)-based substrate. However, the present invention is not limited to such a structure.

The embodiments of the present invention may employ other kinds of substrates including a conductive substrate. Therefore, the embodiments of the present invention may include AlGaInP LEDs on a GaP substrate, GaN LEDs on a SiC substrate, SiC diodes on a sapphire substrate, and/or any combination of nitride-based LEDs on GaN, SiC, AlN, ZnO and/or other substrates. Further, in the present invention, use of an active layer region is not limited to LED regions. In addition, other forms of the active layer region may be employed in compliance with some embodiments of the present invention.

[Semiconductor Thin Film Structure]

As shown in FIG. 1, a plurality of nitride-based semiconductor layers 200 are formed on a substrate 100, using a conventional semiconductor process technology such as a metal-organic chemical vapor deposition (MOCVD) method, a molecular beam epitaxy (MBE) method or the like.

The semiconductors layers 200 may be formed on a substrate with a similar kind of material such as gallium nitride (GaN), or otherwise may be formed on a different kind of substrate such as sapphire ($Al_2O_3$), silicon (Si), silicon carbide (SiC) or the like. Hereinafter, by way of example, the formation of the semiconductor layers 200 are made on a sapphire substrate 100.

The semiconductor layers 200 have a structure including a first conductive semiconductor layer 210, an active layer 220 and a second conductive semiconductor layer 230, which may be sequentially formed on the substrate 100. Hereinafter, the first conductive semiconductor layer 210 may be an n-type GaN semiconductor layer and the second conductive semiconductor layer 230 may be a p-type GaN semiconductor layer, or vice versa, as necessary.

When it is desired to grow a thin film of nitride on the sapphire substrate 100 with an orientation-determining structure, the occurrence of lattice mismatch may lead to deterioration in quality of the resulting thin film. Therefore, preferably a buffer layer 110 may be first formed on the sapphire substrate 100, and the plurality of GaN semiconductor layers 200 may then be formed on the buffer layer 110.

Herein, the buffer layer 110 may comprise of a first buffer layer serving as a seed on the substrate 100 and growing at a low temperature and a second buffer layer may be formed on the first buffer layer and may be made of an undoped GaN semiconductor layer (not shown).

Further, the first buffer layer may also comprise of an $In_xAl_{1-x}N$ or $In_xAl_{1-x}N/GaN$ supperlattice layer.

The active layer 220 may have an InGaN/GaN quantum well (QW) structure. In addition, a material such as AlGaN, AlInGaN or the like may also be used as the material for the active layer 220. The active layer 220 generates light by combination of electron-hole pairs when an electric field is applied through an electrode, which is described later.

In addition, the active layer 220 may have a multi quantum well (MQW) structure by forming a plurality of quantum well (QW) structures, in order to improve the brightness.

In this manner, on the substrate 100 are sequentially formed a series of the GaN semiconductor layers including the GaN buffer layer 110, the first conductive semiconductive layer 210, the InGaN/GaN/AlGaInN active layer 220 having a multi quantum well (MQW) structure, and the second conductive semiconductor layer 230.

Herein, the sapphire substrate 100 typically has a thickness of about 330 to 430 μm and a series of the GaN semiconductor layers 200 have a total thickness of about 10 μm or less.

Figure 2:
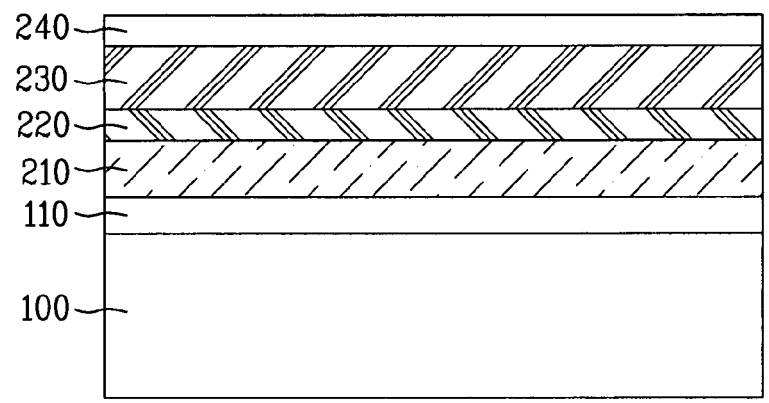

Meanwhile, as shown in FIG. 2, a current diffusion layer 240 may be formed on the second conductive semiconductor layer 230. As the current diffusion layer 240, an $In_xGa_{1-x}N$ layer or an $In_xGa_{1-x}N/GaN$ superlattice layer may be used.

The current diffusion layer 240 may serve to improve the carrier mobility, thereby facilitating the flow of electric current, and is also called as a current transport enhanced layer (CTEL).

[Trench Etching]

Figure 3:
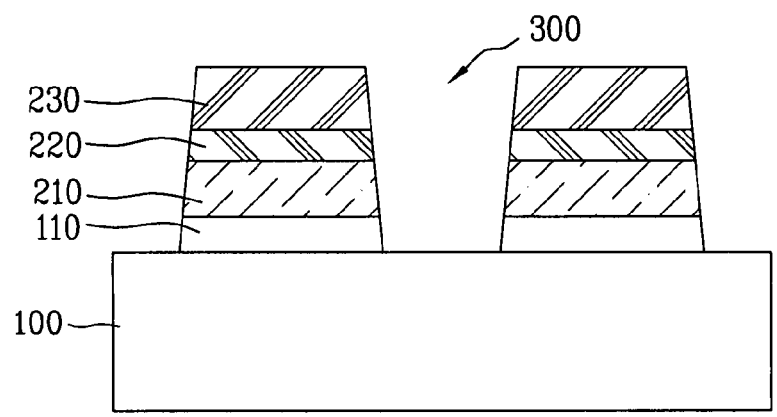

Thereafter, as shown in FIG. 3, etching is carried out in chip separation regions to be separated when chips are completed later, using a dry etching method. That is, etching is carried out through the series of the GaN-based semiconductor layers 200 to the surface portion of the substrate 100 to form a plurality of trenches 300.

Because the series of the GaN-based semiconductor layers 200 and the sapphire substrate 100 are extremely hard, it is preferred to form the trenches 300 by Reactive Ion Etching (RIE), particularly Inductively Coupled Plasma Reactive Ion Etching (ICP RIE).

To form the trenches 300, a photoresist film (not shown) is applied to the GaN-based semiconductor layers 200 by spin coating, and the applied photoresist film is subjected to selective exposure and development processes to thereby form a photoresist film pattern (not shown). Using the ICP RIE method and the thus-formed photoresist film pattern as an etching mask, etching is carried out from the GaN-based semiconductor layers 200 to the surface portion sapphire ($Al_2O_3$) substrate 100 to thereby form trenches 300.

In the above process, photoresist (PR) or a metal mask may be used as the etching mask. For the metal mask, chromium (Cr), nickel (Ni), gold (Au) or the like may be used.

[Primary Ohmic/Reflective Electrode Structure]

Figure 4:
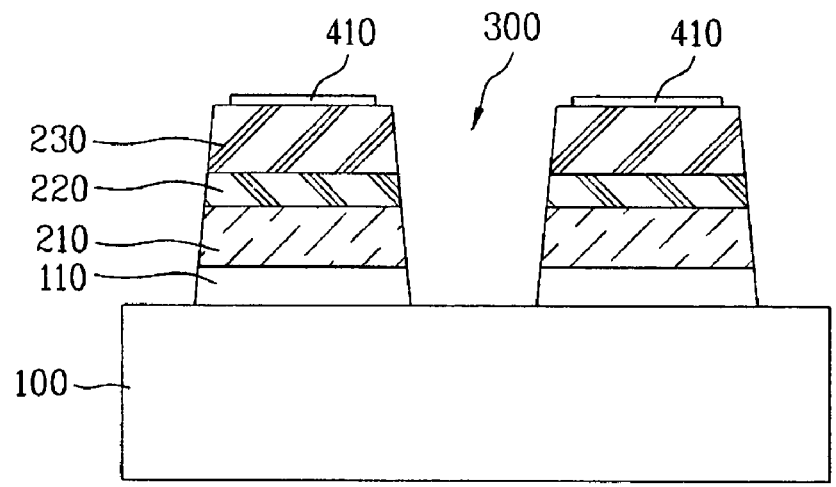

Next, as shown in FIG. 4, first electrodes 410 may be formed on the upper parts of the semiconductor layers 200 separated from each other by the formation of the trenches 300.

Figure 5:
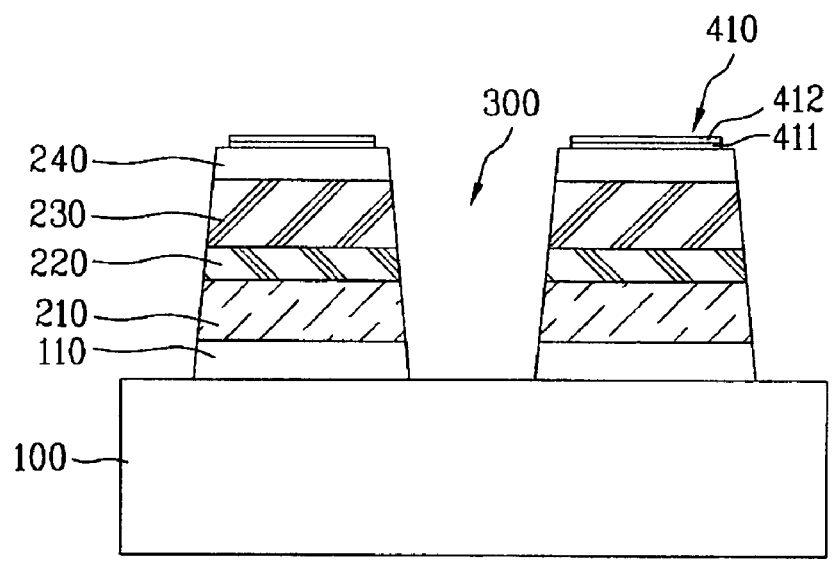

As shown in FIG. 5, a first electrode 410 may comprise of a transparent electrode 411 and a reflective electrode 412.

That is, in order to secure ohmic characteristics, the transparent electrode 411 may be formed with a transparent conductive oxide (TCO). In other words, the transparent electrode 411 may serve as an ohmic electrode.

Where such a transparent electrode 411 is employed, it may be more advantageous to form the transparent electrode 411 on the current diffusion layer 240, utilizing the transparent conductive oxide (TCO).

In such a structure, a work function of the current diffusion layer 240 may be smaller than that of a p-type GaN semiconductor layer constituting the second conductive semiconductor layer 230 and may be greater than that of the transparent electrode 411.

Further, the range of work functions of the current diffusion layer 240 and the second conductive semiconductor layer 230 may be partially overlapped therebetween. Work functions of the second conductive semiconductor layer 230 and the transparent electrode 411 may also be partially overlapped therebetween.

As the transparent conductive oxide constituting the transparent electrode 411, an indium-tin-oxide (ITO) layer may be used. Further, other materials such as indium-zinc-oxide (IZO), aluminum-zinc-oxide (AZO), magnesium-zinc-oxide (MZO), gallium-zinc-oxide (GZO) and the like may also be used as the transparent conductive oxide material.

As discussed above, the reflective electrode 412 may be formed on the transparent electrode 411. An advantage of such an electrode structure is to improve reflectivity.

The reflective electrode 412 may be formed of aluminum (Al), silver (Ag) or the like. Where the supporting layer is formed later, a material capable of being used as a connection metal layer that is a seed metal or a bonding metal may be employed in forming the reflective electrode 412.

Figure 6:
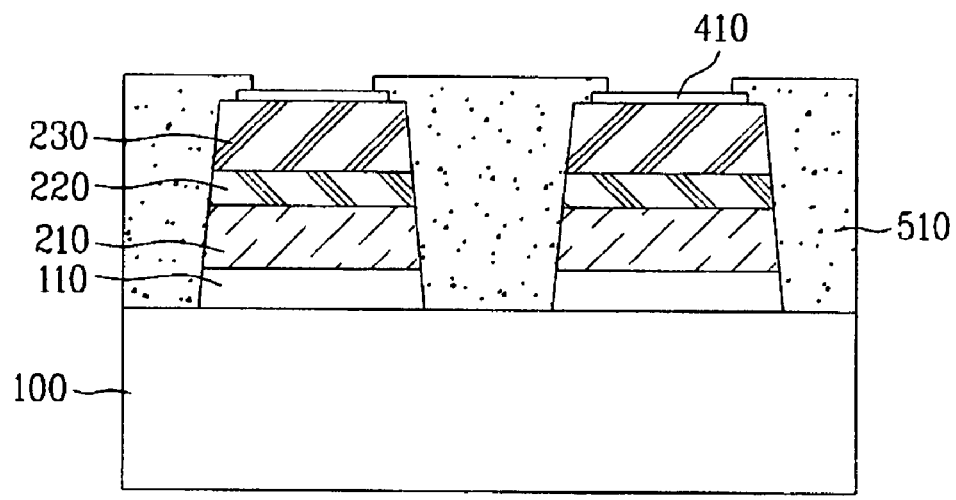

Thereafter, as shown in FIG. 6, passivation layers 510 are formed in the trench 300 regions between semiconductor layers 200 on which the first electrodes 410 were formed.

[Passivation Structure]

The passivation layers 510 protect the individually separated semiconductor layers 200 and chips, suppress the occurrence of leakage current, and may facilitate in the separation of the chips while alleviating an impact applied to the semiconductor layers 200, upon performing a subsequent separation process of the substrate 100.

Examples of the material constituting the passivation layer 510 may include $SiO_2$, SU-8 (epoxy-based photoresist (PR)), WPR (acrylic-based PR), SOG, polyimide and the like, and may be appropriately selected taking into consideration various factors such as hardness, elastic modulus and transmissivity of the materials to be used, adhesion between materials and the like. These materials may be used alone or in any combination thereof.

Mechanical properties of the material constituting the passivation layer 510 are shown in Tables 1 and 2 below. As can be seen from Tables 1 and 2, $SiO_2$ exhibits tensile strength and elastic modulus superior to other materials, and therefore is most resistant to stress that may occur during a chip separation process. In addition, it can be seen that $SiO_2$ exhibits lower adhesion with the sapphire substrate 100, as compared to SU-8, and therefore an impact applied to the chip during a stress release process may be reduced.

TABLE 1

Adhesion data according to kinds of passivation Materials

| 46 MPa | 61 MPa |
|---|---|
| $SiO_2$ (PECVD) | SU-8 Passivation |
| Sapphire | Sapphire |

TABLE 2

Mechanical strength of passivation Materials

| | Materials | | |
|---|---|---|---|
| | $SiO_2$ | SU-8 | WPR |
| Tensile Strength | 8 GPa | 55 MPa | 90 MPa |
| Elastic modulus | 71.7 GPa | 2.05 GPa | 2.2 GPa |

These materials may be advantageously used to fabricate light emitting devices via the application thereof to the structure as shown in FIG. 6. However, it should be noted that single use of $SiO_2$ may lead to increased leakage current by the occurrence of micro fissures due to stress occurred during the chip separation process. In order to alleviate such a problem, a structure of the passivation layer 510 using a combination of $SiO_2$ and SU-8 may be used.

The passivation layer 510 may be formed to cover at least a portion of the first electrode 410 and at least one surface of the semiconductor layers 200. For example, when the first electrode 410 is comprised of the transparent electrode 411 and the reflective electrode 412, the passivation layer 510 may be formed to cover at least portions of the transparent electrode 411 and reflective electrode 412, and sides of the semiconductor layers 200.

Further, after forming of passivation layers 510 covering a certain portion of the transparent electrode 411 and sides of the semiconductor layers 200, the reflective electrode 412 may be formed on the transparent electrode 411.

Herein, the reflective electrode 412 may comprise of plural layers. That is, the reflective electrode 412 may comprise of a first metal layer (not shown), a diffusion barrier layer disposed on the first metal layer, and a second metal layer disposed on the diffusion barrier layer.

The first metal layer may be formed with Ni, W, Ti, Pt, Au, Pd, Cu, Al, Cr, Ag or an alloy of any combination thereof, and the diffusion barrier layer may be formed of Ni, W, Ti or Pt. As the second metal layer, an Au layer or a Cu layer may be used.

Further, the first metal layer, the diffusion barrier layer and the second metal layer may be formed of a single alloy layer.

Meanwhile, an adhesion layer (not shown) may be disposed between the transparent electrode 411 and the reflective electrode 412, and may be formed with Ni, W, Cr or the like.

As the first electrode 410, an integration electrode may also be used that is capable of achieving combined ohmic characteristics and reflective characteristics. The integration electrode may be formed with Ni, W, Ti, Pt, Au, Pd, Cu, Al, Cr, Ag or an alloy of any combination thereof.

On the other hand, the first electrode 410 may comprise of plural layers. That is, the first electrode 412 may comprise of the first metal layer (not shown) that may employ Ni, W, Ti, Pt, Au, Pd, Cu, Al, Cr, Ag or an alloy of any combination thereof.

A diffusion barrier layer may be disposed on the upper part of the first metal layer, and a second metal layer may be disposed on the upper part of the diffusion barrier layer. The diffusion barrier layer may employ a Ni, W, Ti or Pt layer, and the second metal layer may employ an Au layer or a Cu layer.

Further, the first metal layer, the diffusion barrier layer and the second metal layer may be formed as a single alloy layer.

Thereafter, heat treatment may be carried out to ensure the ohmic characteristics of the LED. The heat treatment may be carried out at a temperature of 300 to 700° C. under atmosphere of $N_2$ or $O_2$ gas.

The second metal layer may also be used as a connection metal layer. Otherwise, a separate connection metal layer may also be applied.

Figure 7:
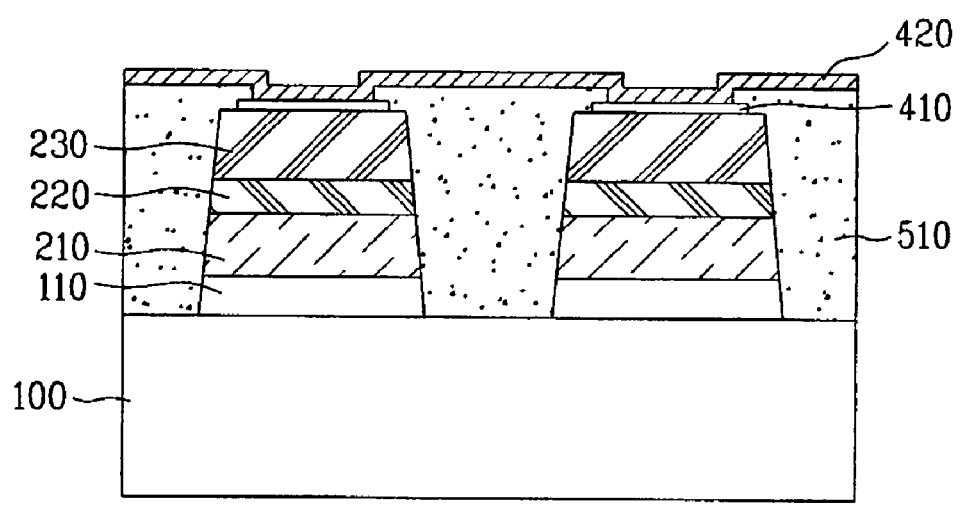

Next, as shown in FIG. 7, at least one connection metal layer 420 may be formed that covers a portion or an entire portion of the first electrode 410 and the passivation layer 510.

The connection metal layer 420 is intended for forming a supporting layer by a conventional method such as plating or wafer bonding, in a subsequent process. The connection metal layer 420 may be formed with Cu, Au, Sn, In, Ag or an alloy of any combination thereof or a stack of any combination thereof.

The connection metal layer 420 may be used as seed metal for forming of the supporting layer by a conventional method such as plating, or otherwise may be a bonding metal for attaching a separate wafer.

[Photoresist (PR) Post Structure]

Figure 8:
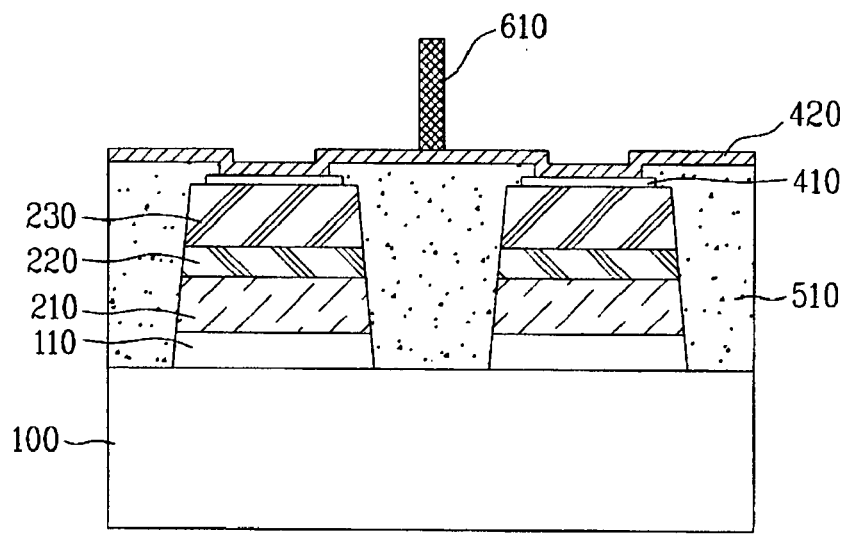

Next, as shown in FIG. 8, a PR post 610 for facilitating the chip separation may be formed on the upper side of the chip separation region in which passivation layers 510 were formed, i.e., in this case, on the upper side of connection metal layer 420.

A role of the PR post 610 is to make relatively thick photoresist (PR) to a desired structure for the chip separation. The PR post 610 may have a height ranging from a small value of 20 to 30 μm to a large value of 150 μm, and a width ranging of 10 μM to several tens of μm. The PR post 610 may also be advantageously used in the chip separation using laser scribing.

That is, the PR post 610 may also be regarded as a structure forming barriers in each chip separation region, using PR materials.

[Primary Plating]

Figure 9:
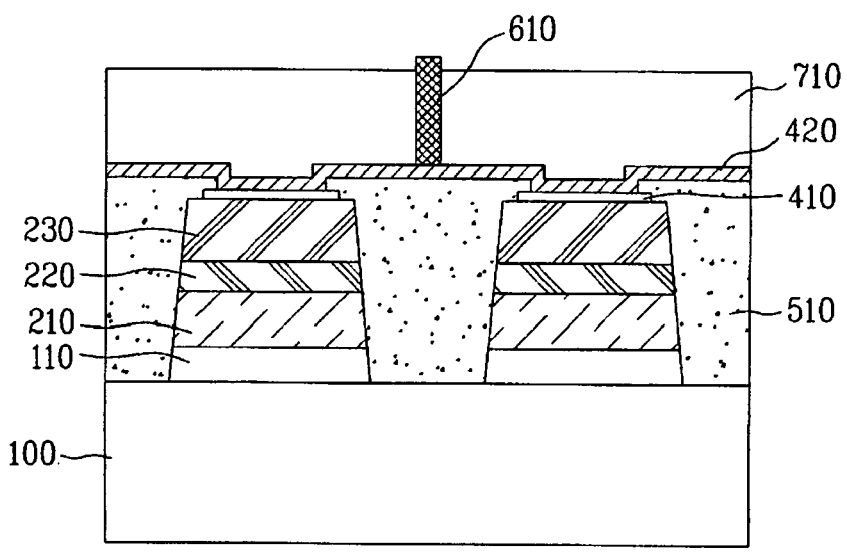
Figure 10:
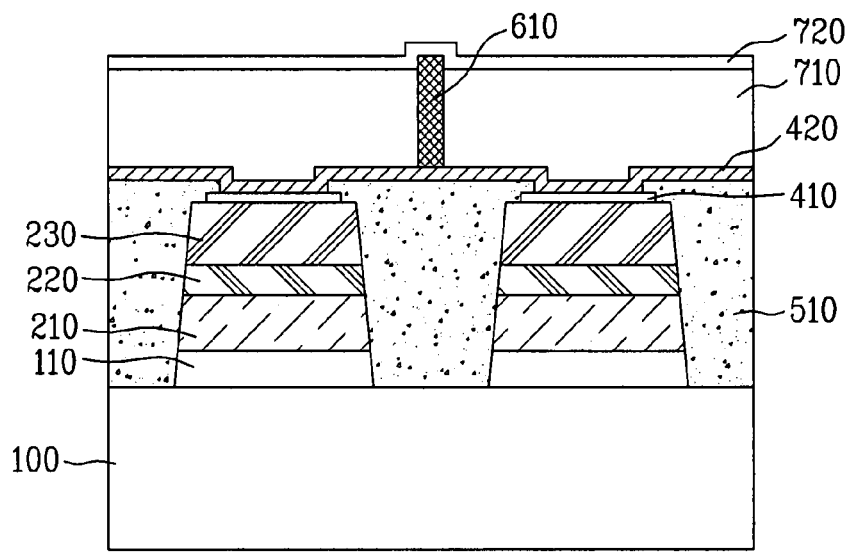
Figure 11:
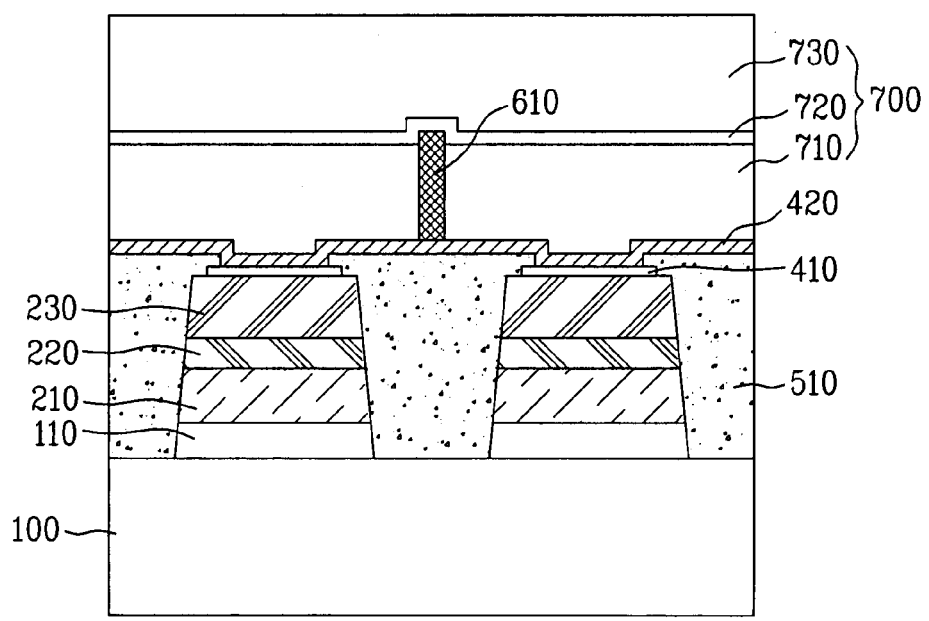

On the upper side of the thus-formed PR post 610, a supporting layer 700 may be formed using a plating method or the like, as shown in FIGS. 9 to 11.

The supporting layer 700 may be in a monolithic form, or otherwise may be formed as several layers, as shown in FIGS. 9 to 11.

In other words, a first supporting layer 710 may be first formed to a height equal to or lower than that of the PR post 610. The first supporting layer 710 may be formed to have a height about 5 μm smaller than the thickness of the PR post 610.

The thickness of the supporting layer 700 may be determined taking into consideration the thickness of the final chip, and the thickness of the first supporting layer 710 having a value ranging from 50 to 150 μm.

[Etch Stop Layer (ESL)]

As shown in FIG. 10, an etch stop layer 720 may be formed on the first supporting layer 710. The etch stop layer 720 may be formed as a metal layer covering the entire region including the protruded region of the PR post 610 formed on the upper part of the first supporting layer 710.

Therefore, when a final chip separation process is carried out, it is possible to obtain a chip having uniform thickness in a final chip step, by uniform etching upon removal of a second supporting layer 730 may be subsequently formed on the upper side of the etch stop layer 720.

Typically, the first supporting layer 710 or the second supporting layer 730 is formed of copper (Cu). The etch stop layer 720 may utilize metal components having an etch resistance to such a copper etchant, and may be formed with Cr, Ni, Au, or an alloy thereof, for example.

[Secondary Plating]

As shown in FIG. 11, a second supporting layer 730 may be formed on the etch stop layer 720. The second supporting layer 730 may be formed to have a thickness of about 50 to 150 μm. Such a second supporting layer 730 may be removed using a copper-specific etchant in a subsequent chip separation process and may serve as a supporting layer upon separation of the substrate 100, thereby maintaining a stable structure against handling of the chips. The second supporting layer 730 may be formed by a plating method.

[Laser Lift-Off (LLO)]

Figure 12:
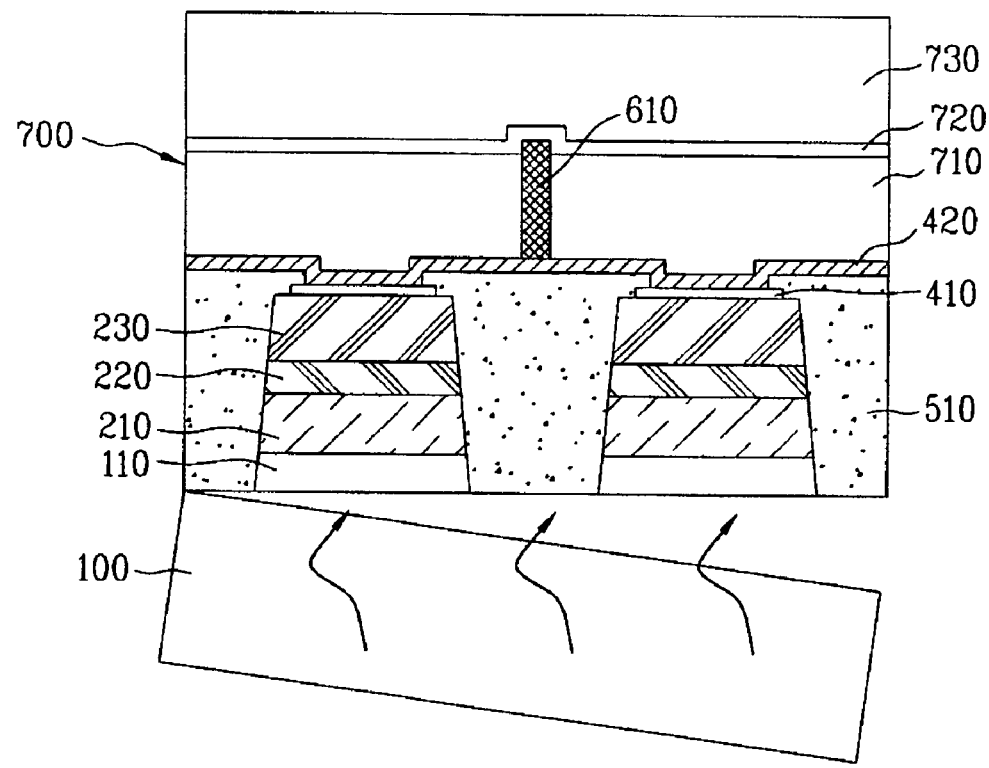

Thereafter, as shown in FIG. 12, the substrate 100 may be separated by a separation process of the substrate 100. The separation of the substrate 100 may be carried out using a laser, so called a "Laser Lift-Off (LLO)" process.

The separation process of the substrate 100 from the semiconductor layers 200 may be immediately carried out by generation of an acoustic stress wave between the sapphire substrate 100 and the GaN-based semiconductor layers 200.

Such a separation process of the substrate 100 may be carried out by the following process. KrF excimer laser beam having a wavelength of 248 nm or ArF excimer laser beam having a wavelength of 193 nm is irradiated at the interface between the sapphire substrate 100 and the GaN-based semiconductor layers 200 through the sapphire substrate 100.

Because light having the above range of the wavelength is not absorbed by the sapphire substrate 100 but is absorbed by the GaN-based semiconductor layers 200, the laser beam passed through the sapphire substrate 100 is absorbed at a surface of the semiconductor layers 200, which is then rapidly heated.

Then, the heated surface of the GaN-based semiconductor layers 200 begins to melt and forms high-temperature and high-pressure surface plasma. Such a plasma formation is usually confined to the interface between the sapphire substrate 100 and semiconductor layer 200.

Next, plasma formed by melting the surface of the semiconductor layers 200 rapidly expands into the surroundings. This rapid plasma expansion brings about generation of an acoustic stress wave around the interface between the substrate 100 and semiconductor layers 200.

As such, the acoustic stress wave generated at the interface serves to apply a physical force to the sapphire substrate 100 and the semiconductors layer 200 in opposite directions from each other, and consequently the separation between the substrate 100 and GaN-based semiconductor layers 200 is achieved as a result.

Hereinafter, the separation between the sapphire substrate 100 and the GaN-based semiconductor layers 200 will be reviewed in more detail with reference to FIGS. 13 to 16.

FIGS. 13 to 16 show a separation process between the sapphire substrate 100 and GaN-based semiconductor layers 200 according to an embodiment of the present invention. For convenient illustration, only the sapphire substrate 100 and the GaN-based semiconductor layer 200' are shown.

Figure 13:
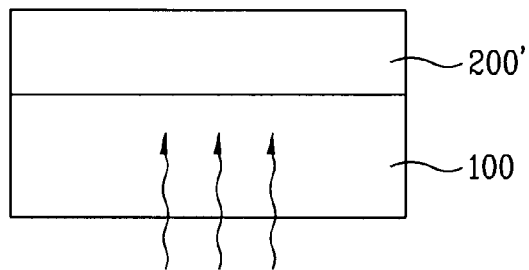

First, as shown in FIG. 13, KrF excimer laser beam having a wavelength of 248 nm or ArF excimer laser beam having a wavelength of 193 nm is irradiated at the interface between the sapphire substrate 100 and the GaN-based semiconductor layer 200' through the sapphire substrate 100.

In order to achieve uniform distribution of an energy density of the laser beam at the laser beam spot irradiated at the target interface, it is preferred to irradiate the laser beam under a condition in which a beam homogenizer (not shown) is positioned between a laser light source (not shown) and the sapphire substrate 100.

When the beam homogenizer is used as described above, a uniformity of the laser beam energy density is about 95% or higher. Because light having the above-specified wavelength range is not absorbed by the sapphire substrate 100, but is absorbed by the GaN-based semiconductor layer 200', the laser beam that passes through the sapphire substrate 100 is absorbed by the GaN-based semiconductor layer 200' at the interface between the sapphire substrate 100 and GaN-based semiconductor layer 200'. Therefore, a surface of the GaN-based semiconductor layer 200' is rapidly heated by absorption of laser beam energy.

Figure 14:
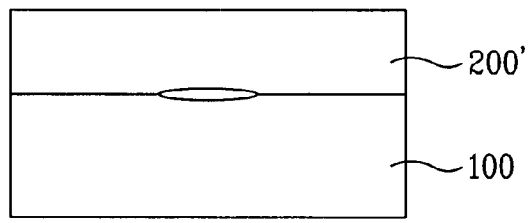

Then, the heated surface of the GaN-based semiconductor layer 200' begins to melt and forms high-temperature and high-pressure surface plasma, as shown in FIG. 14. Such plasma formation is confined only to the interface between the sapphire substrate 100 and GaN-based semiconductor layer 200'.

Figure 15:
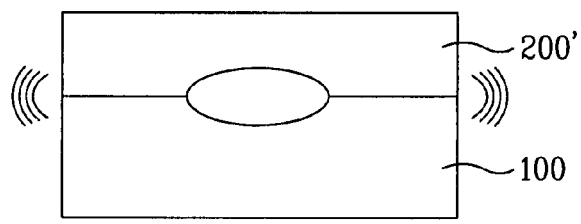

Next, as shown in FIG. 15, plasma formed by melting of the surface of the GaN-based semiconductor layer 200' rapidly expands into the surroundings thereabout. The rapid plasma expansion brings about generation of an acoustic stress wave around the interface between the sapphire substrate 100 and GaN-based semiconductor layer 200'.

Figure 16:
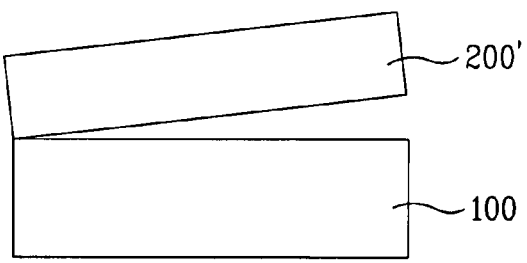

The acoustic stress wave generated at the interface serves to apply a physical force to the sapphire substrate 100 and the GaN-based semiconductor layer 200' in oppposite directions from each other. Therefore, as shown in FIG. 16, the separation between the sapphire substrate 100 and GaN-based semiconductor layer 200' is achieved as a result.

Figure 17:
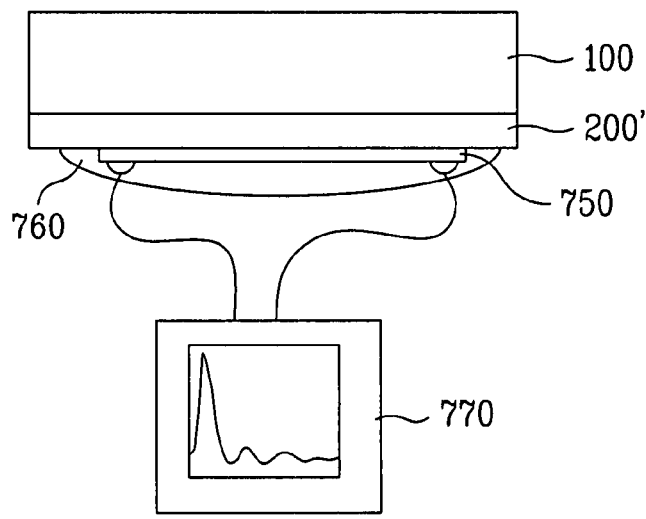

Experiments were carried out to examine changes of pressure over time, generated at the interface between the sapphire substrate 100 and the GaN-based semiconductor layer 200' when the laser beam was irradiated. FIG. 17 schematically shows an experimental apparatus measuring pressure generated by the laser beam irradiation, using a conventional piezo film sensor 750, and FIG. 18 is a graph showing the measurement results.

As shown in FIG. 17, the piezo film sensor 750 was attached to the GaN-based semiconductor layer 200', using an epoxy resin 760. The pressure of sonic wave generated by the irradiation of single-pulse laser was detected by the piezo film sensor 750, and an oscilloscope 770 was connected to the piezo film sensor 750, in order to monitor electrical signals outputted from the sensor 750. For the irradiation laser, KrF excimer laser having a wavelength of 248 nm and an energy density of 0.9 J/cm$^2$ was used. The pressure of sonic wave detected by the sensor 750 was converted into electrical signals using a conversion constant of $13 \times 10^{-3}$ V/N, and was then outputted.

Figure 18:
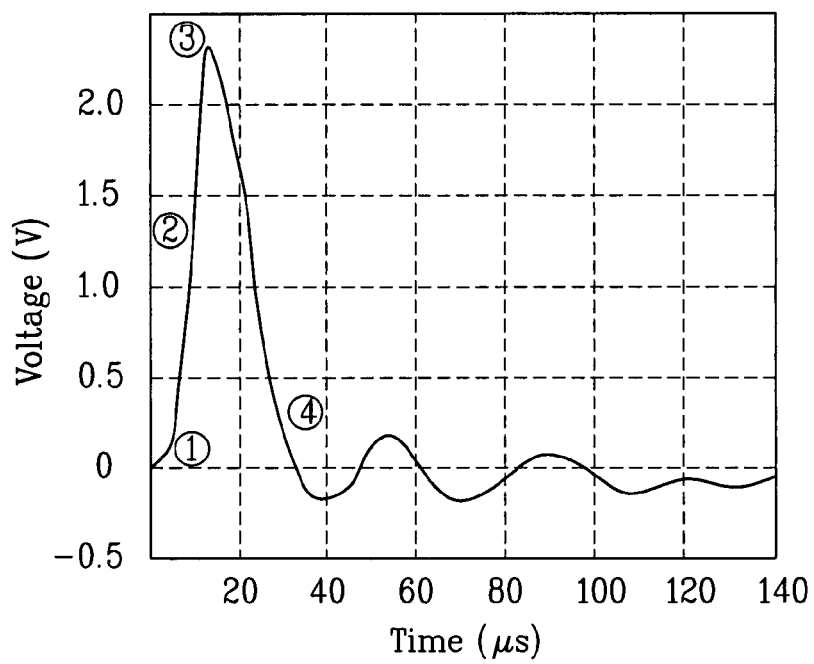

As shown in the graph of FIG. 18, a signal having a maximum value was detected at around 15 μs, the duration of the first main peak was about 30 μs, and thereafter several peaks appeared with a sharply declined intensity.

Zones 1, 2, 3 to 4 of the first peak in the graph of FIG. 18 correspond to FIGS. 13, 14, 15 and 16, respectively. That is, Time point 1 refers to an irradiation step of laser beam to the interface between the sapphire substrate 100 and GaN-based semiconductor layer 200'; Time point 2 refers to a plasma generation step after melting of the GaN-based semiconductor layer 200' portion at the interface, due to the irradiation of laser beam; Time point 3 refers to a generating step of an acoustic stress wave by rapid expansion of the generated plasma; and Time point 4 refers to an immediate separation step of the sapphire substrate 100 from the GaN-based semiconductor layer 200', by the acoustic stress wave.

The duration of the first peak was about 30 μs. Therefore, the above graph illustrates clearly that the separation of the sapphire substrate 100 from the GaN-based semiconductor layer 200', achieved by the acoustic stress wave generated at the interface between the sapphire substrate 100 and GaN-based semiconductor layer 200', took only about 30 μs.

Figure 19:
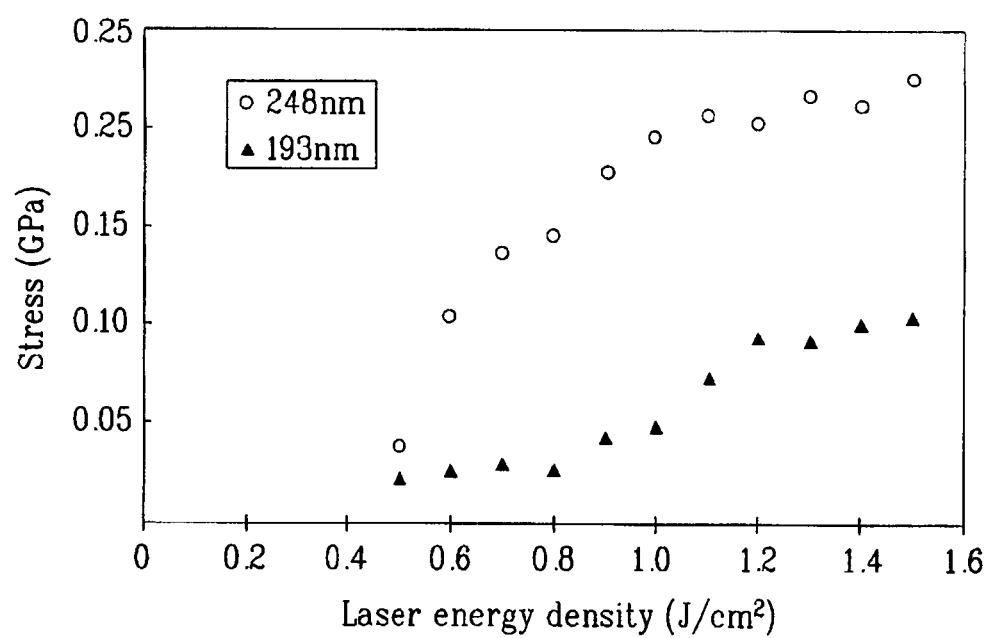

On the other hand, in order to examine effects of the laser-beam energy density on generation of the acoustic stress wave, a laser energy beam having a wavelength of 248 nm and a laser energy beam having a wavelength of 193 nm, with varying energy density, have irradiated at the interface between the sapphire substrate 100 and the GaN-based semiconductor layer 200', respectively, and then the highest (maximum) value of stress generated by the acoustic stress wave was measured. FIG. 19 is a graph showing the acoustic stress with respect to a varying energy density, for the 248 nm-laser beam and the 193 nm-laser beam, respectively.

As shown in the graph of FIG. 19, the acoustic stress was very weak or was not substantially detected at the energy density of less than 0.50 J/cm$^2$ for the 248 nm-laser beam, and an immediate separation of the sapphire substrate was not possible at the energy density of less than 0.60 J/cm$^2$ for both the 248 nm-laser beam and the 193 nm-laser beam.

That is, because a critical energy density of the laser beam, at which plasma formation takes place after melting of the GaN-based semiconductor layer 200', is about 0.30 J/cm$^2$, it can be seen that the separation of the sapphire substrate itself may be possible if the irradiated laser has an energy density of more than 0.30 J/cm$^2$, but an immediate separation of the sapphire substrate cannot be achieved at the energy density of less than 0.60 J/cm$^2$.

Therefore, in order to take advantage of a mechanical or physical force, e.g. an acoustic stress wave, upon the separation of the sapphire substrate 100 from the GaN-based semiconductor layer 200', the irradiating laser should have the energy density of at least more than 0.50 J/cm$^2$. In addition, for an immediate separation of the sapphire substrate 100, the irradiating laser preferably shall have the energy density of more than 0.60 J/cm$^2$.

Meanwhile, as shown in the graph of FIG. 19, it was measured that acoustic stress is significantly higher for the 248 nm-laser beam under the same conditions, as compared to the 193 nm-laser beam. This is because the 193 nm-laser beam undergoes a greater loss of beam, as compared to the 248 nm-laser beam, when the laser beam passes through the sapphire substrate.

When the beam loss was measured upon penetration of the beam through the sapphire substrate 100 having a thickness of 450 μm, the 248 nm-laser beam exhibited the beam loss of about 15%, whereas the 193 nm-laser beam exhibited the beam loss of about 22%.

As discussed above, the acoustic stress wave generated at the interface between the sapphire substrate 100 and GaN-based semiconductor layer 200' may apply a high impact to a GaN layer within a laser beam spot region.

Figure 20:
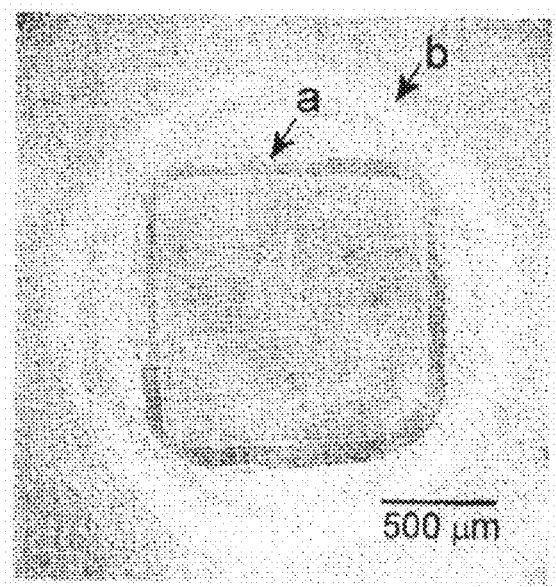
Figure 21:
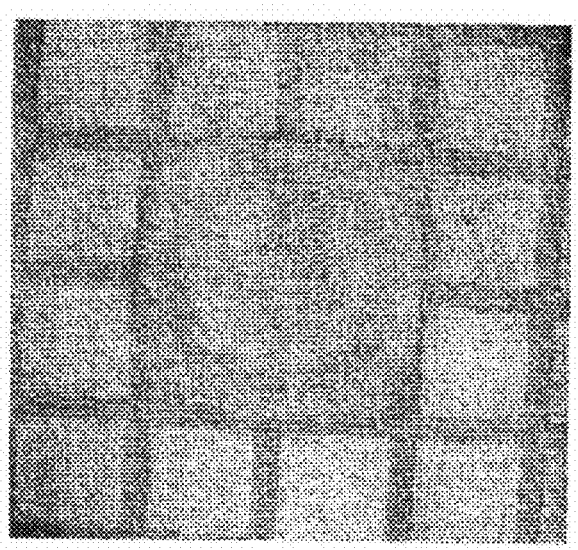
Figure 22:
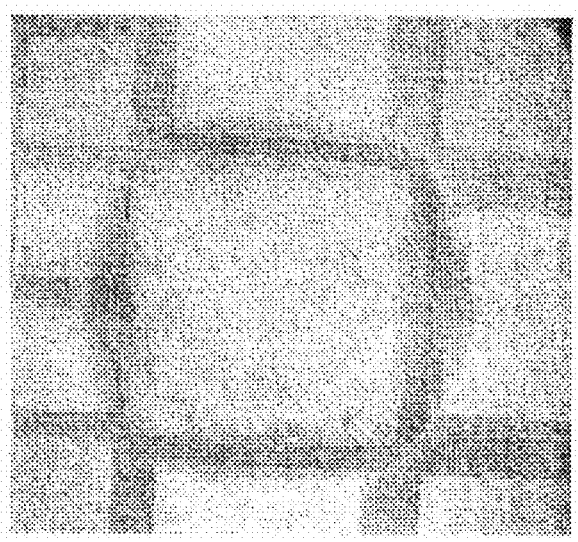
Figure 23:
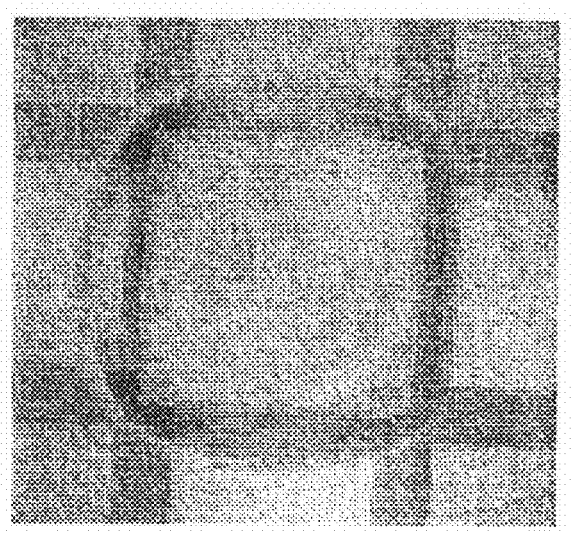
Figure 24:
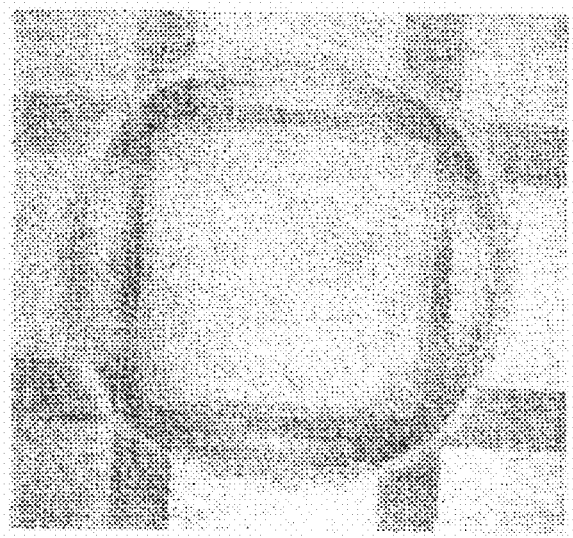
Figure 25:
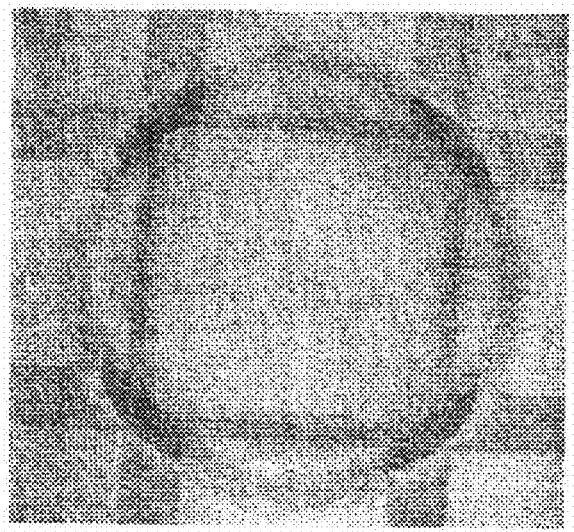
Figure 26:
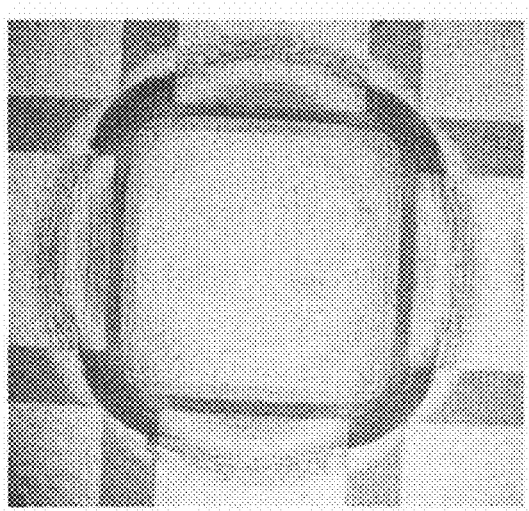

FIG. 20 is a scanning electron micrograph (SEM) showing the impact applied by the acoustic stress wave generated upon the irradiation of the 248 nm-laser beam having an energy density of 1.0 J/cm$^2$ to the interface between the monolithic GaN layer and sapphire substrate.

In FIG. 20, Arrow a represents damage of the GaN-based semiconductor layer occurred around edges of a square-shaped beam spot, and Arrow b represents a trajectory of the acoustic stress wave developed at the interface. That is, as indicted by the photograph of FIG. 20, if the irradiated laser beam has an excessively high energy density, the GaN layer may be damaged due to high impact caused by the acoustic stress wave.

Hence, in order to prevent the damage of the GaN-based semiconductor layer simultaneously with immediate separation of the sapphire substrate, it is necessary to optimize the energy density of the irradiated laser beam.

In order to find an optimal energy density of the laser beam, observations were made for the damage of the GaN-based semiconductor layer that occurred when the energy density of the laser beam, irradiated at the interface between the monolithic GaN layer and sapphire substrate, was 0.75 J/cm$^2$, 0.80 J/cm$^2$, 0.85 J/cm$^2$, 0.90 J/cm2, 0.95 J/cm$^2$, and 1.00 J/cm2, respectively. The results thus obtained are given in SEMs of FIGS. 21 to 26.

As can be seen from FIGS. 21 to 26, when it is desired to make the separation between the monolithic GaN layer and sapphire substrate, the laser beam energy density of 0.75 J/cm$^2$ results in slight damage to the GaN-based semiconductor layer, whereas an increased energy density of the laser beam, when exceeding 0.75 J/cm$^2$, leads to more severe damage of the GaN-based semiconductor layer. Therefore, the optimal energy density of the laser beam is in the range of 0.60 to 0.75 J/cm$^2$, when making separation between the monolithic GaN layer and sapphire substrate.

Optionally, as mentioned already in the preferred embodiments of the present invention, it is possible to block lateral propagation of the acoustic stress wave generated at the interface between the sapphire substrate and GaN-based semiconductor layer, by forming trenches that pass through the GaN-based semiconductor layer to reach the sapphire substrate or to penetrate into a portion of the substrate.

As a result, it is possible to prevent damage of the GaN layer in a broader range of energy density values. It was observed that there is no damage of the GaN layer even at a high energy density of up to 1.10 J/cm$^2$. Therefore, when such trenches are formed, the laser beam energy density is preferably in a range of 0.60 to 1.10 J/cm$^2$.

Figure 27:
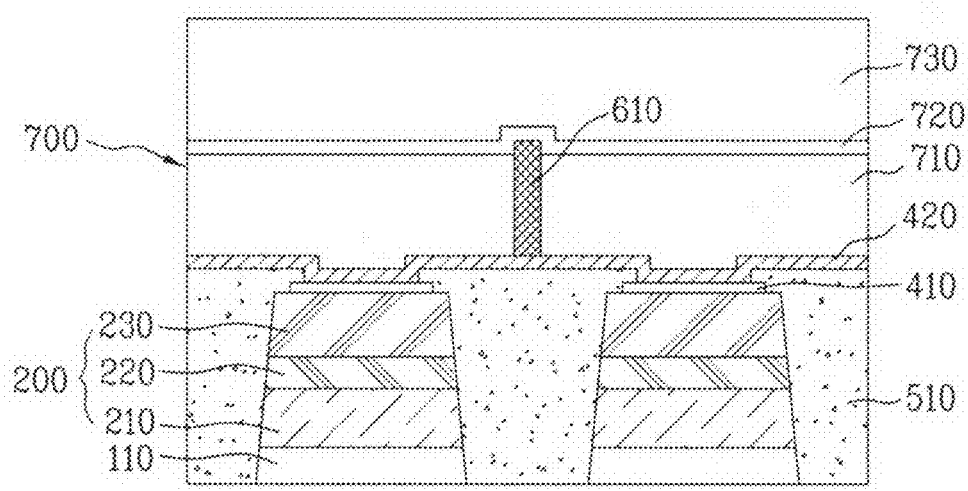
Figure 28:
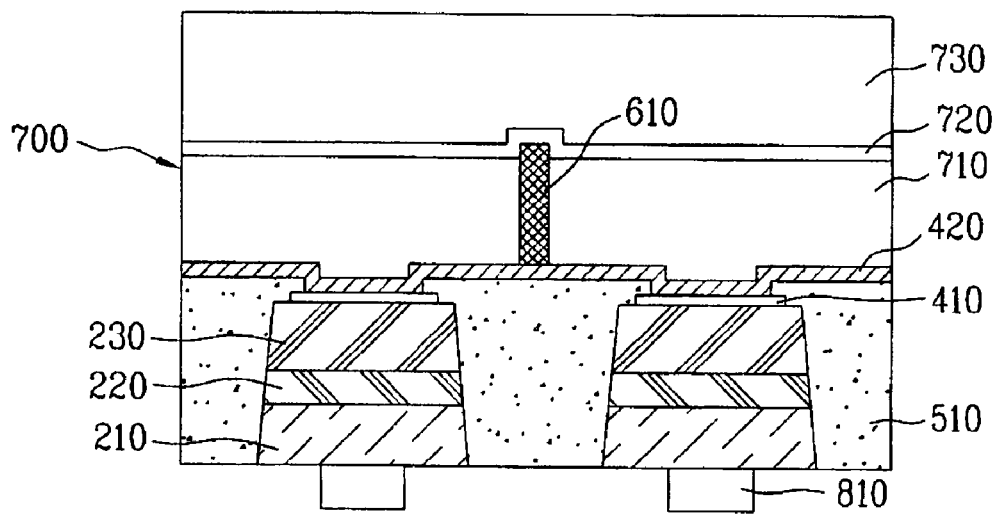

Removal of the sapphire substrate 100 according to the above-mentioned process results in a structure as shown in FIG. 27. Thereafter, the buffer layer 110 may be removed by an etching process, thus leaving a structure as shown in FIG. 28.

As such, under the condition in which the substrate 100 and the buffer layer 110 were removed, an n-type, first conductive semiconductor layer 210 of the semiconductor layer 200 is exposed and a second electrode 810 may be formed on the thus-exposed layer 210. In this case, the second electrode may be an n-type electrode and may be an ohmic electrode that may be in ohmic contact with a second conductive semiconductor layer 230.

[Surface Light-Extraction Structure]

Figure 29:
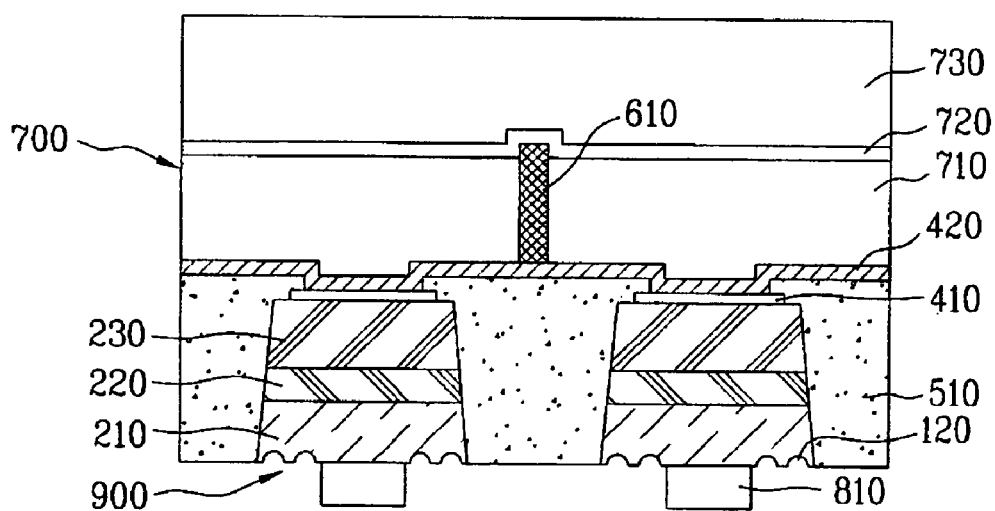

A light-extraction structure 900, as shown in FIG. 29, may be formed on the first conductive semiconductor layer 210 exposed by the removal of the substrate 100, as described above. Forming such a light-extraction structure 900 may further improve a light-extraction efficiency of light generated from the light emitting diode.

Forming such a light-extraction structure 900 may be carried out, for example, using the following three methods.

Figure 30:
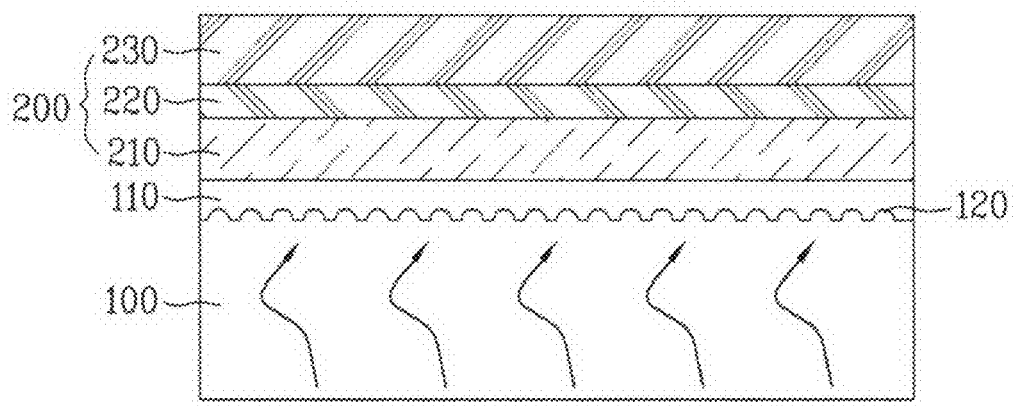
Figure 31:
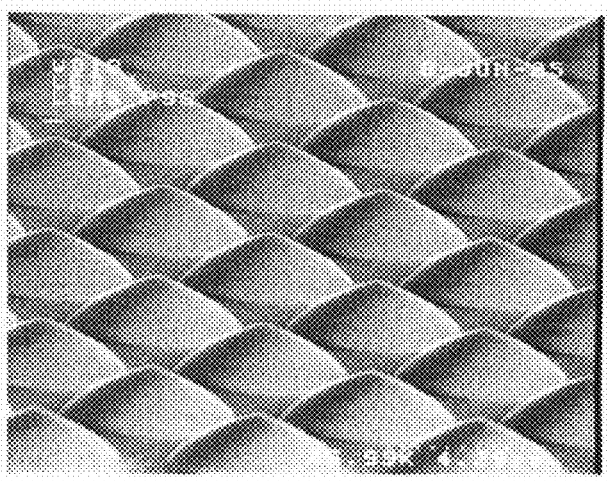

In the first method, upon growing the buffer layer 110 and semiconductor layers 200 on the substrate 100, the buffer layer 110 and semiconductor layers 200 are formed by introducing an irregular structure 120 into the substrate 100, as shown in FIG. 30. FIG. 31 shows an example of an irregular pattern 120 that is formed.

In such a manner, when the buffer layer 110 and semiconductor layers 200 are formed on the substrate 100 having the irregularities 120 formed thereon, the irregularities 120 may be exposed on the surface of the first conductive semiconductor layer 210 after the separation process of the substrate 100, thereby forming a light-extraction structure 900.

Figure 32:
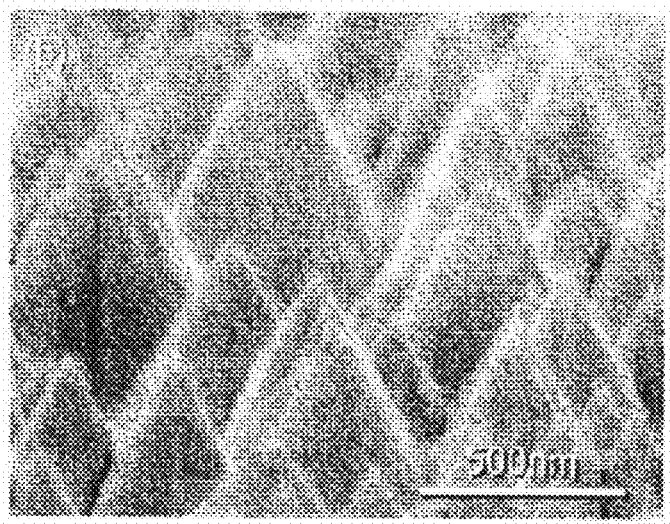

In the second method, the surface of the thus-exposed first conductive semiconductor layer 210 may be subjected to chemical etching to thereby form a light-extraction structure 900. FIG. 32 shows the light-extraction structure 900 formed by the etching process.

Figure 33:
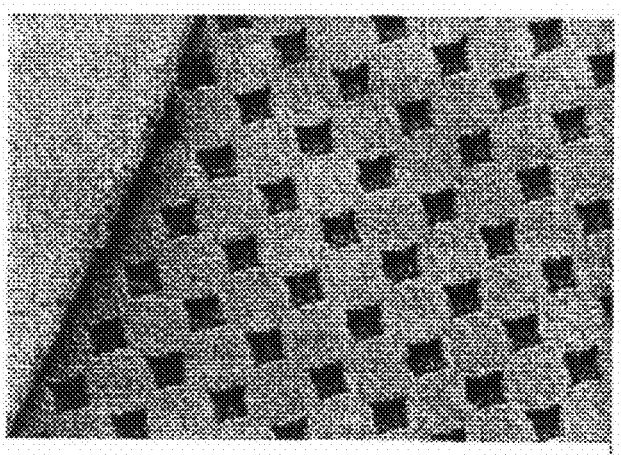

In the third method, a light-extraction structure 900 may be formed by forming micro patterns and etching the resulting patterns to form photonic crystals. FIG. 33 shows the light-extraction structure 900 obtained by forming such a photonic crystal structure.

Figure 34:
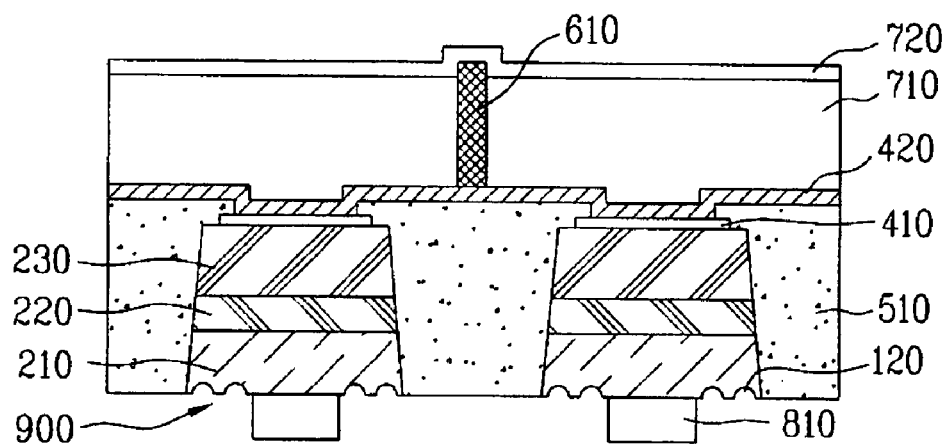

After forming the light-extraction structure 900, the second supporting layer 730 may be removed by etching. Herein, as described above, the etch stop layer 720 is etch resistant to an etchant of the second supporting layer 730, and therefore is not etched, thereby resulting in a structure as shown in FIG. 34.

Figure 35:
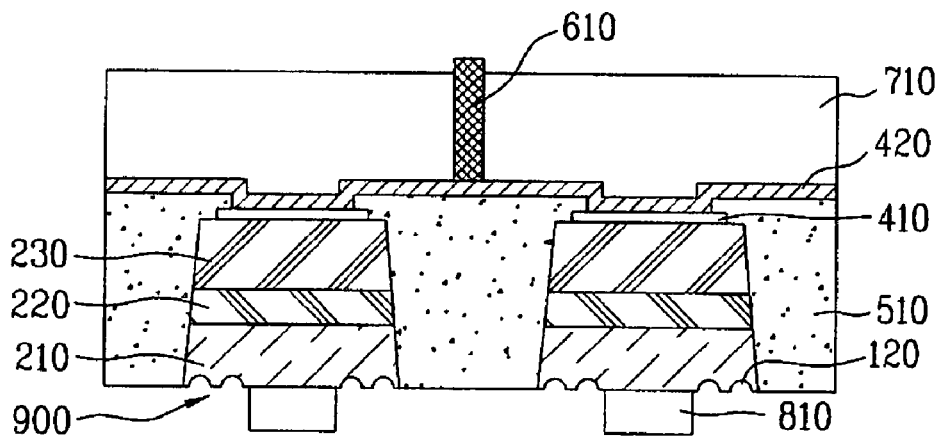
Figure 36:
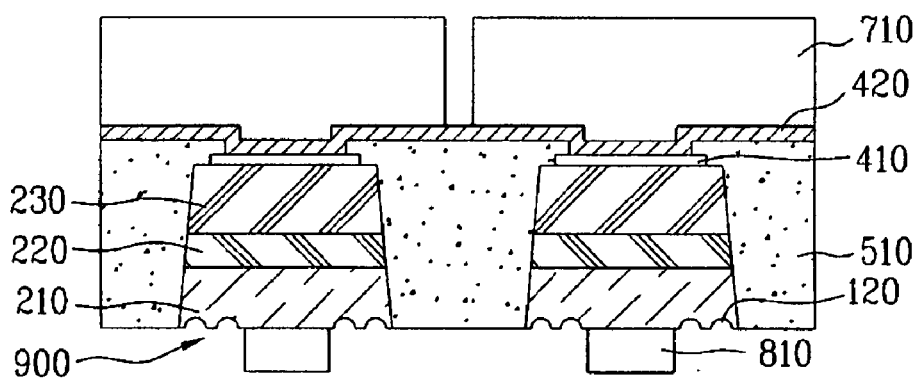

Thereafter, as shown in FIG. 35, when the etch stop layer 720 is also removed by a separate etching process, the PR post 610 may be exposed and may also be removed, thereby resulting in a structure as shown in FIG. 36.

Figure 37:
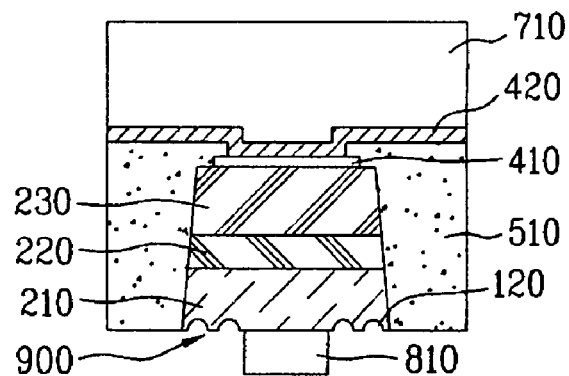

As shown in FIG. 36, where the PR post 610 was removed in the above process, respective chip separation regions may be connected therebetween via the connection metal layer 420 and the passivation layers 510 and may be easily separated by a conventional method such as tape expansion. FIG. 37 shows the state of the chip that was finally separated by such a process.

[Passivation Open Structure]

Although the above-mentioned structure is directed to a structure in which the passivation layers 510 are filled in the trenches 300 formed in chip separation regions, the passivation structure formed in the trenches 300 may have various forms depending upon the efficiency of the substrate 100 separation process and chip separation process.

Figure 38:
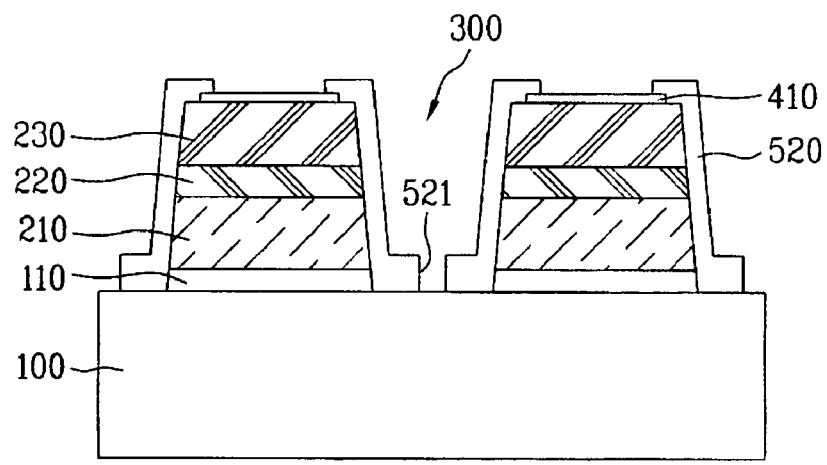
FIGS. 38 to 53 are cross-sectional views illustrating respective manufacturing steps of an LED having vertical topology according to a second embodiment of the present invention.

That is, the semiconductor layers 200 may be formed on the substrate 100, and in that state, the trenches 300 may be formed in the chip separation regions. Thereafter, the first electrodes 410 may be formed on the semiconductor layers 200, and as shown in FIG. 38, passivation films 520 filling some portions of trenches 300 may be formed in trench 300 regions.

Forming the semiconductor layers 200, trenches 300 and first electrodes 410 on the substrate 100 may be carried out in the same manner as in the above embodiment.

According to such a structure, the passivation films 520 passivating only around chips may be formed and the remaining portions may be open to form openings 521, instead of achieving passivation by completely filling the trench 300 regions between chips, using photoresist.

In this way, forming the openings 521 on the passivation film 520 may lead to lowering of adhesion between the passivation film 520 and substrate 100, and therefore a passivating material may be formed of a single material (for example, PR material such as SU-8 or WPR). In addition, such an opening structure serves to alleviate stress, generated upon separation of the substrate 100, within the chip separation regions, thus making it possible to reduce mechanical damage applied to the chips, and consequently obtaining stable device characteristics.

In fact, if laser lift-off (LLO) was carried out under the condition in which the trenches 300 were completely filled with a certain material such as SU-8, high adhesion characteristics between SU-8 and the surface of sapphire substrate 100 would lead to a failure to effectively alleviate stress generated upon performing LLO, which in turn results in the transfer of an impact to the chips, thereby causing the occurrence of cracks, chip breaking, and delamination of thin films.

Therefore, the structure, which carries out passivation functions by forming of the passivation films 520 having openings 512 while only some regions are attached to the sapphire substrate 100, may provide for easy separation from the substrate 100, upon performing LLO.

[Trench Fill Structure]

Figure 39:
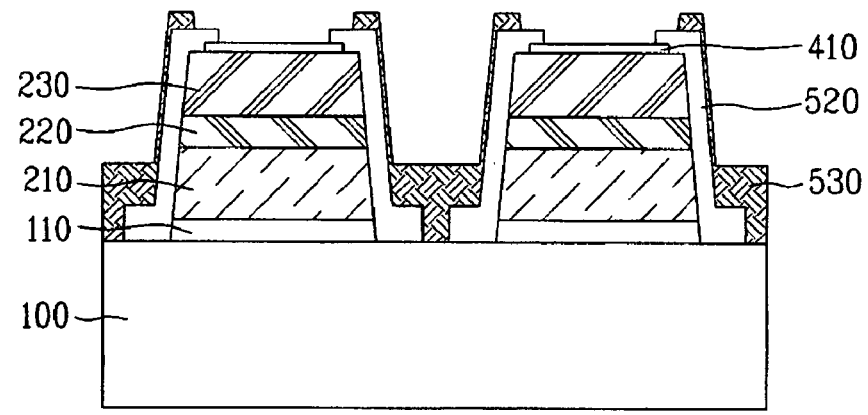

In such a manner, due to the formation of the passivation films 520 on portions of the trenches 300, spaces may be formed in the trenches 300 formed in the chip separation regions, as shown in FIG. 38. At this time, when metal layers 530 are filled in at least portions of the spaces, as shown in FIG. 39, the metal layers 530 may serve to further alleviate stress generated upon performing LLO.

The structure including the formation of the metal layers 530 is a structure applied to alleviate stress during LLO and to facilitate the chip separation. As shown in FIG. 39, the metal layers 530 may be partially or completely filled in the trenches 300 in which the passivaton films 520 were formed.

Figure 40:
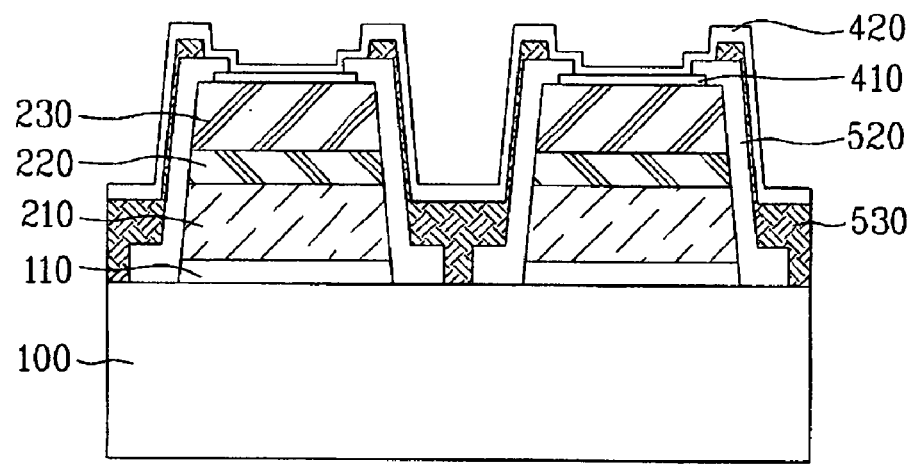

The metal layers 530 may be formed prior to forming the connection metal layers 420 and after forming the first electrodes 410. That is, as shown in FIG. 40, the connection metal layers 420 are formed after forming the metal layers 530.

The metal layer 530 may be formed with Ni, Ag, Au, Cr, Cu or any combination thereof.

Figure 41:
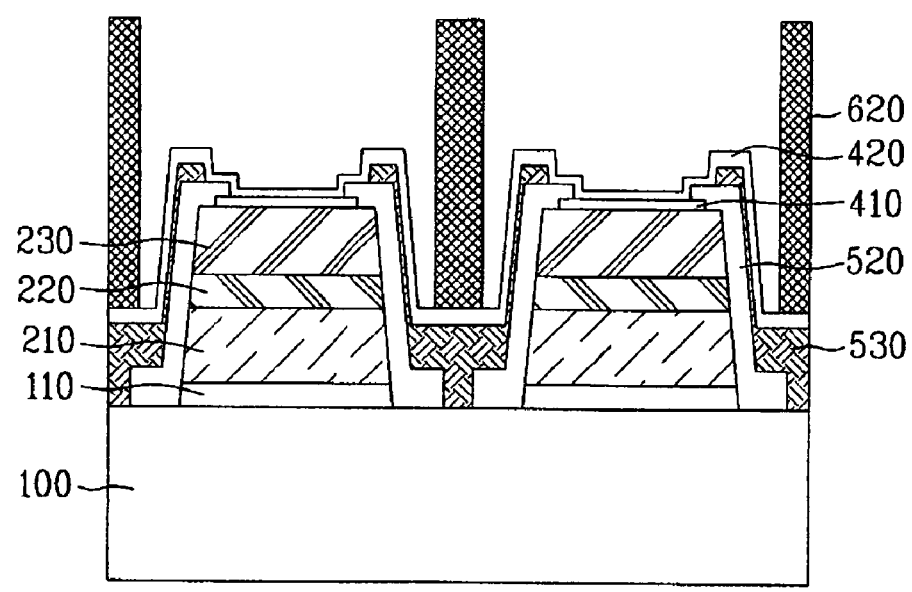
Figure 42:
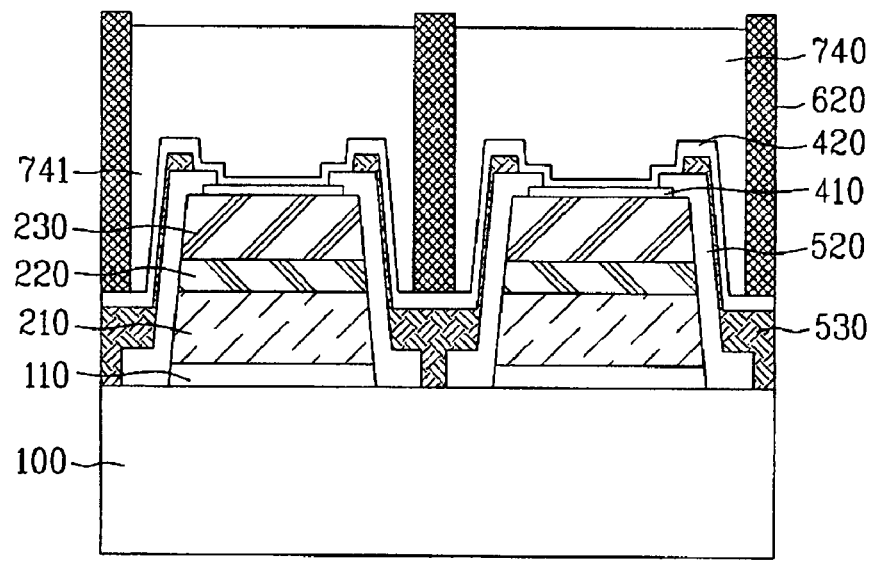

After forming the connection metal layers 420, the PR posts 620 may be formed in the chip separation regions, as shown in FIG. 41. Thereafter, first supporting layers 740 may be formed in the regions between the PR posts 620, as shown in FIG. 42.

Alternatively, the first supporting layers 740 may cover and support the upper sides of the connection metal layers 420. Therefore, it is possible to more effectively support the chips by forming the edges 741 that cover and support the semiconductor layer 200 simulataneously with side parts thereof.

Figure 43:
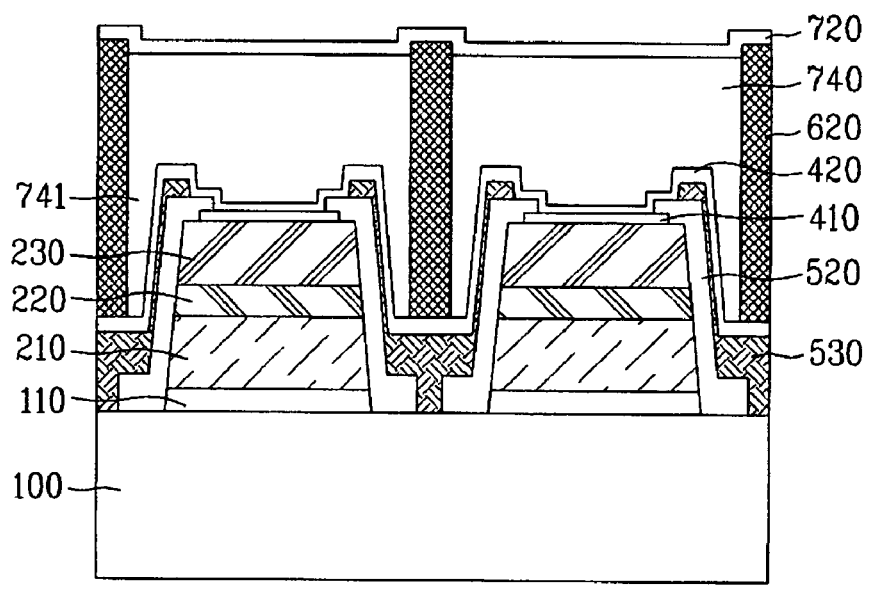
Figure 44:
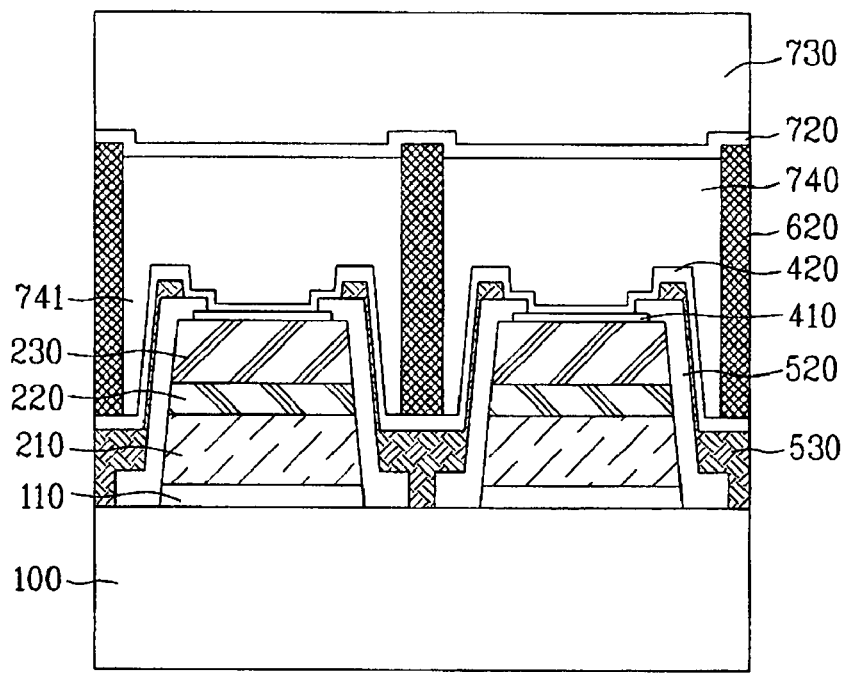

Thereafter, as shown in FIGS. 43 and 44, the etch stop layer 720 and the second supporting layer 730 may be sequentially formed on the first supporting layer 740. This process may be carried out in the same manner as in the above embodiment.

Figure 45:
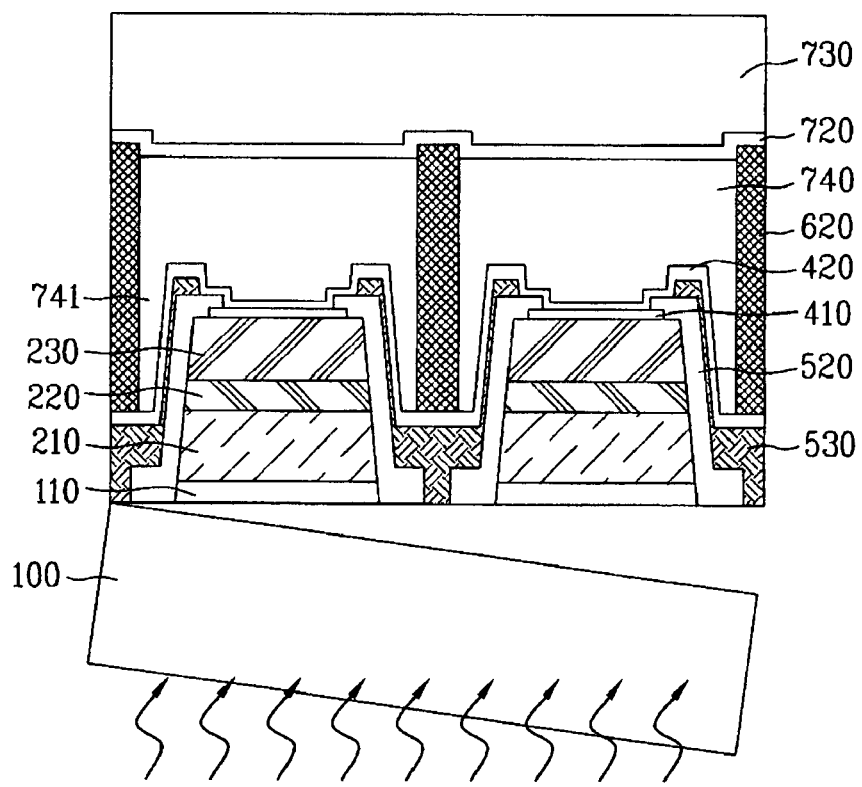
Figure 46:
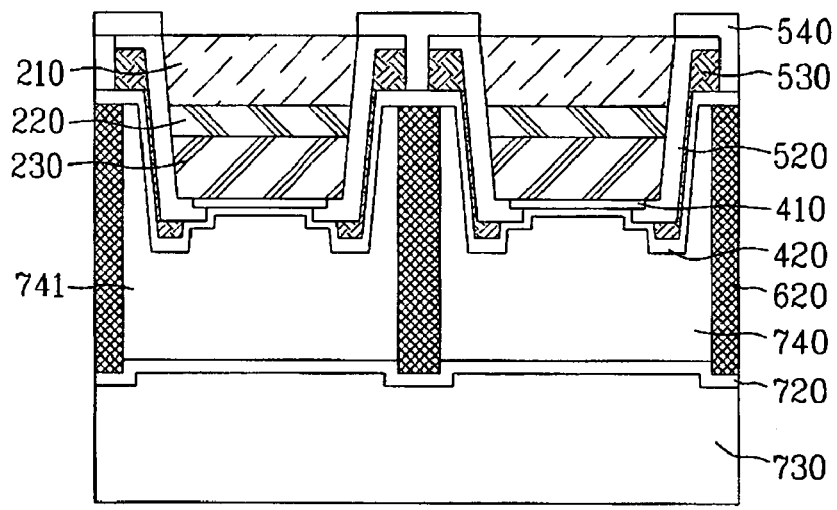

In addition, as shown in FIG. 45, the substrate 100 may be removed from the resulting structure, and the buffer layer 110 may be also removed. At this time, protective layers 540 for protecting the passivation films 520 may be formed, thereby resulting in a structure as shown in FIG. 46.

Next, according to processes shown in FIGS. 47 to 50, the light-extraction structures 900 and second electrodes 830 may be formed on the first conductive semiconductor layers 210 exposed by the removal of the substrate 100.

Figure 47:
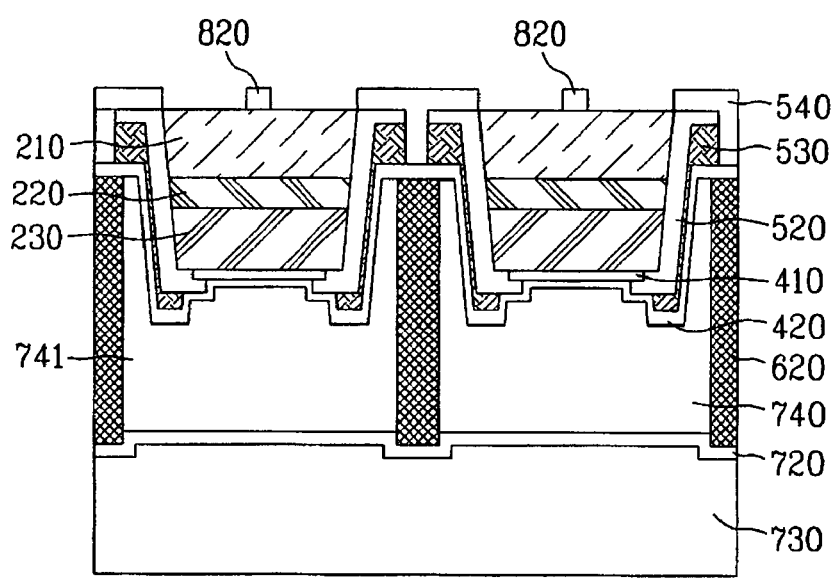
Figure 48:
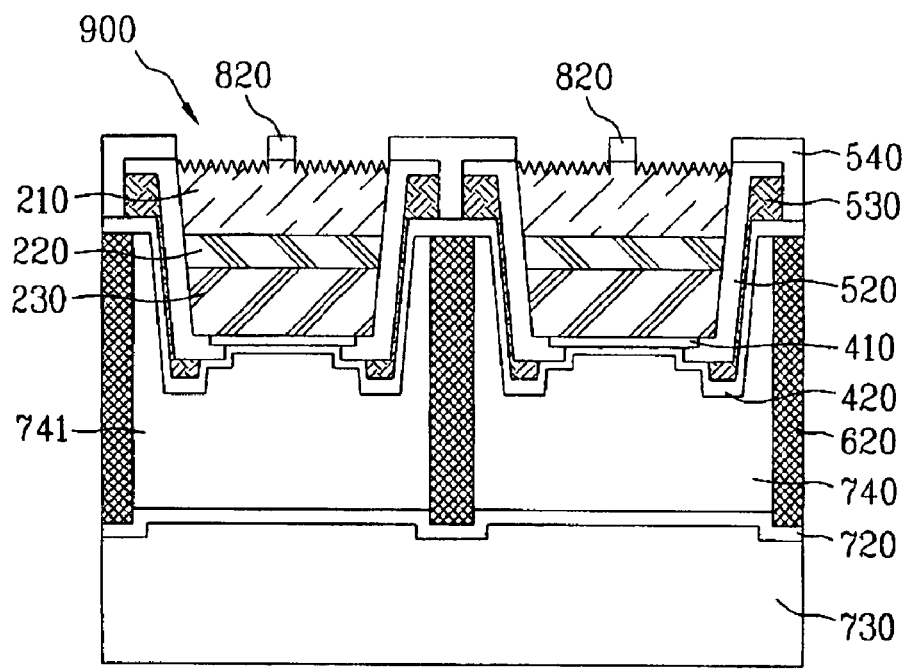

For this purpose, masks 820 for forming the second electrodes 830 may be formed as shown in FIG. 47, and thereafter the light-extraction structures 900 may be formed as in FIG. 48. The light-extraction structures 900 may be similar to those defined above. The light-extraction structures 900 may be formed by treating the surface of the first conductive semiconductor layer 210, or by forming the conductive semiconductors 200 with irregularities on the substrate 100.

Figure 49:
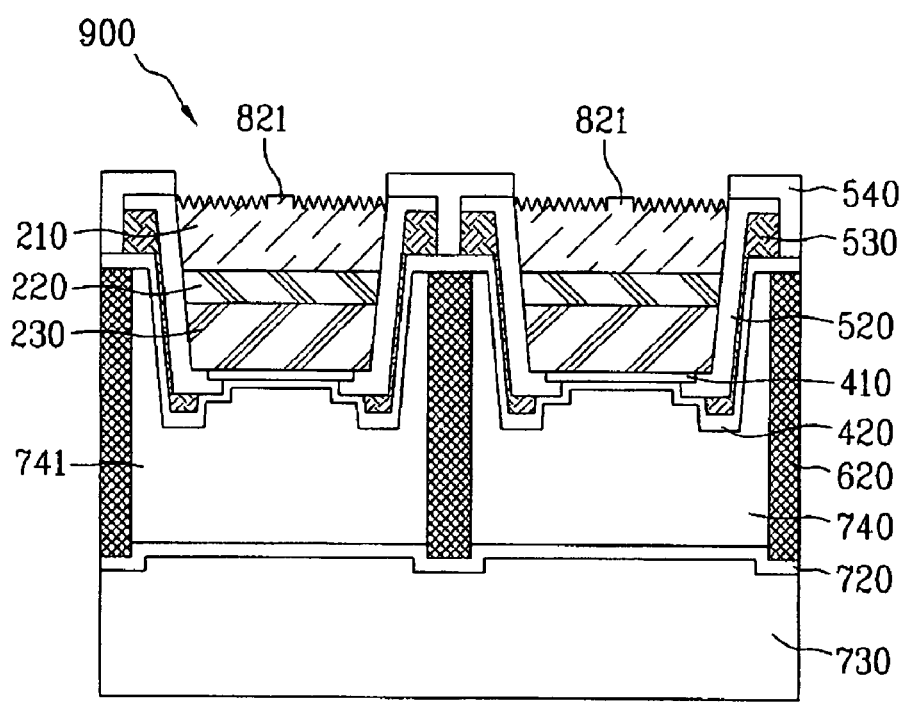
Figure 50:
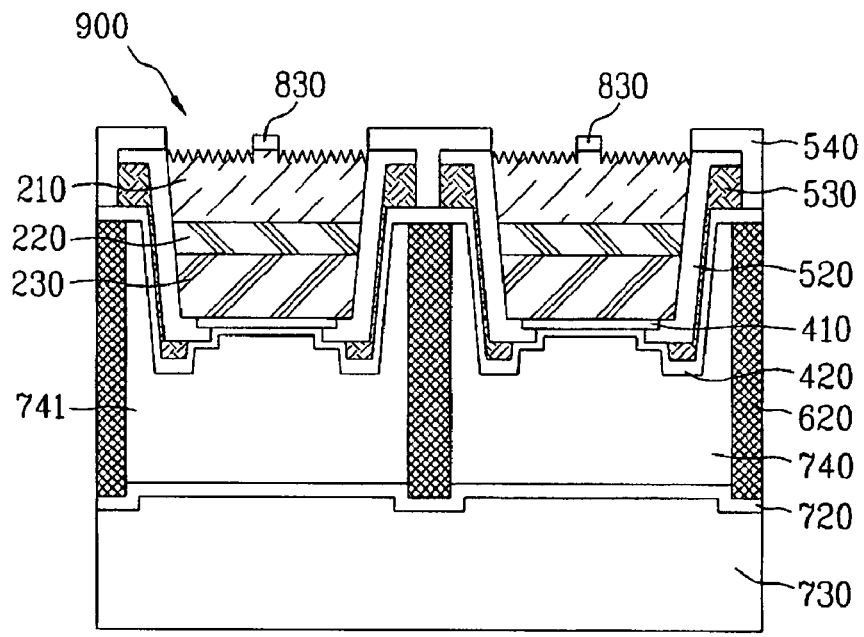

Thereafter, the masks 820 may be removed as shown in FIG. 49, and second electrodes 830 may be formed of electrode materials as shown in FIG. 50.

Figure 51:
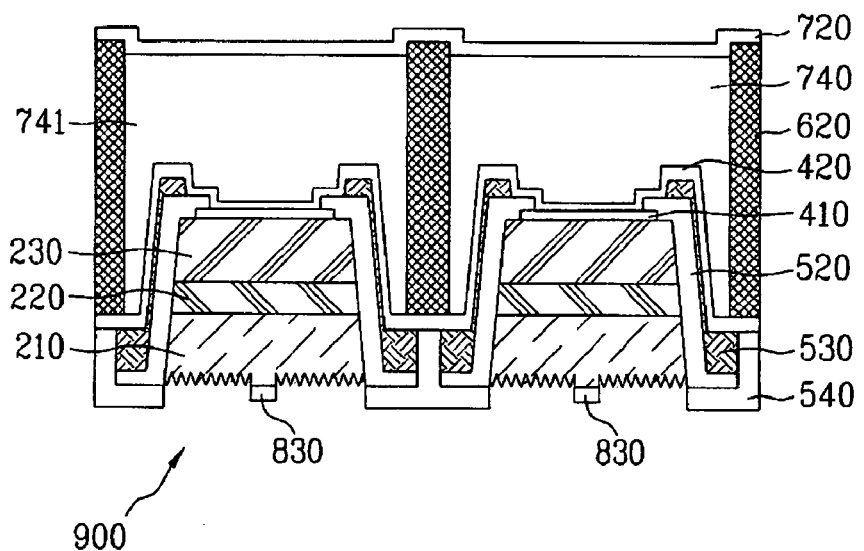
Figure 52:
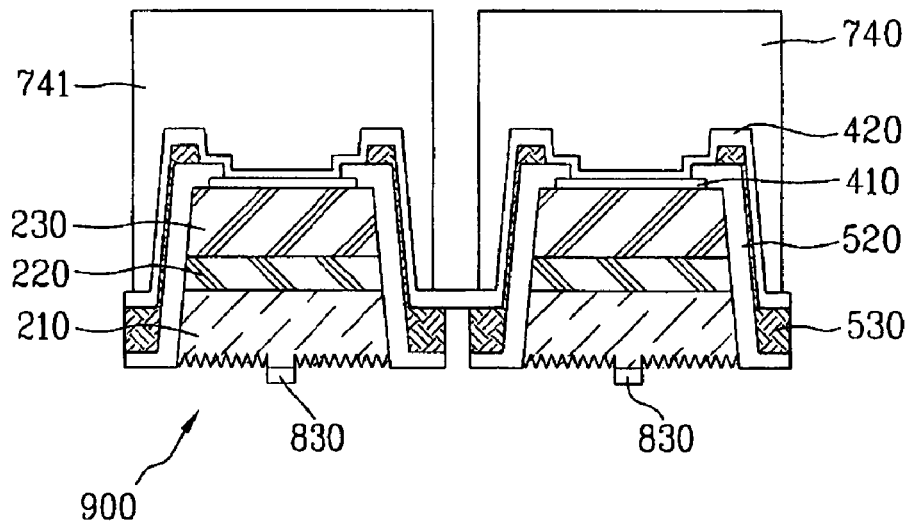

After the second electrodes 830 are formed as above, the second supporting layer 730 and the etch stop layer 720 may be sequentially removed as shown in FIGS. 51 and 52, and the PR posts 620 may then be removed, thereby resulting in a structure as shown in FIG. 52.

Figure 53:
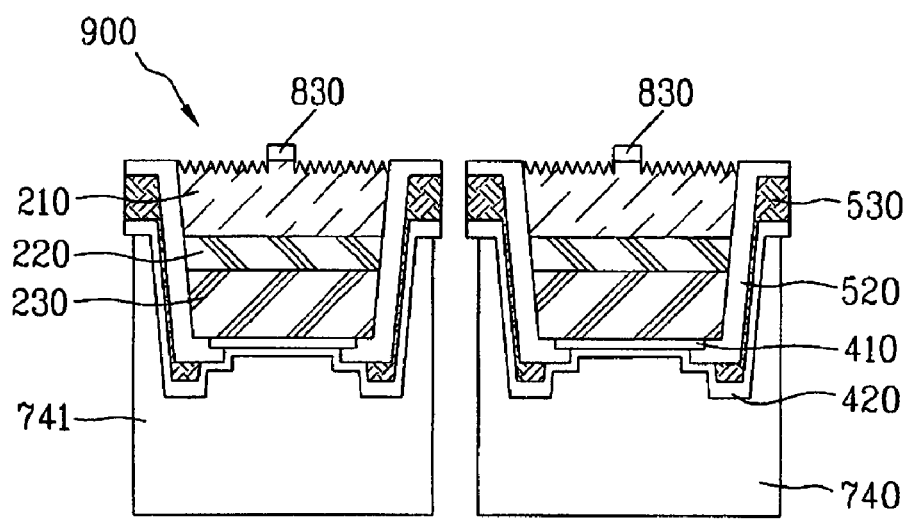

Thereafter, the chips may be separated into each chip by a conventional method such as tape expansion, thereby forming a structure as shown in FIG. 53.

On the other hand, in the above-mentioned manufacturing process, the passivation related to the substrate and chip separation processes, and the structure related to the PR post may be embodied in various forms.

Figure 54:
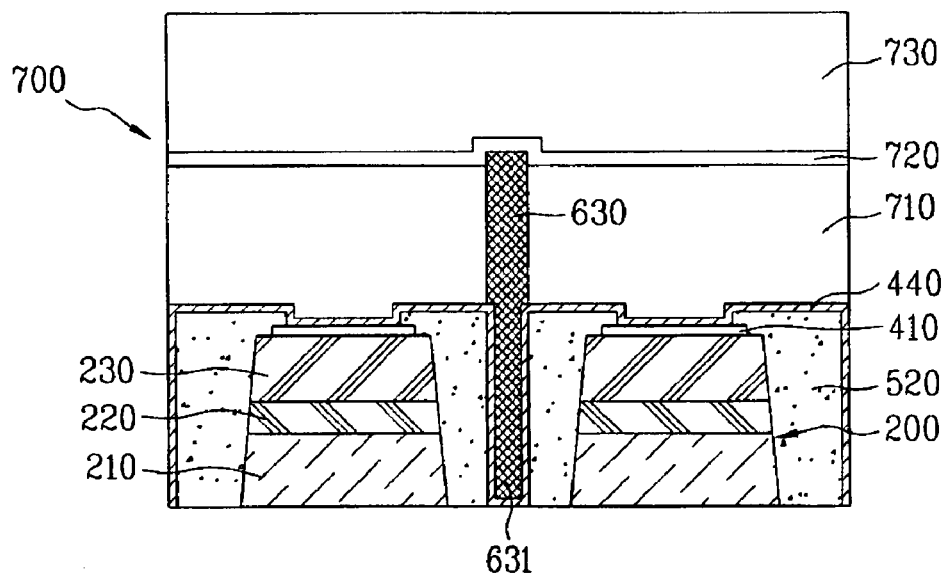
FIG. 54 is a cross-sectional view of an LED formation according to a third embodiment of the present invention.

That is, as shown in FIG. 54, the trench regions between the semiconductor layers 200 may be partially filled with the passivation films 520, and the reflective seed metal layers 440 may be formed on the upper sides of the passivation films 520 and the semiconductor layers 200.

The reflective connection metal layers 440 may comprise of plural layers. That is, the reflective connection metal layer 440 may comprise of a first metal layer (not shown) that may be formed using Ni, W, Ti, Pt, Au, Pd, Cu, Al, Cr, Ag or an alloy of any combination thereof.

A diffusion barrier layer may be disposed on the upper part of the first metal layer, and a second metal layer may be disposed on the upper part of the diffusion barrier layer. The diffusion barrier layer may employ a Ni, W, Ti or Pt layer, and the second metal layer may primarily employ an Au layer or a Cu layer.

In addition, the first metal layer, the diffusion barrier layer and the second metal layer may be formed as a single alloy layer.

When the reflective seed metal layer 440 is formed as described above, the first electrode 410 may be a transparent electrode, which may be formed of a transparent conductive oxide (TCO).

For example, an indium-tin-oxide (ITO), indium-zinc-oxide (IZO), aluminum-zinc-oxide (AZO), magnesium-zinc-oxide (MZO), gallium-zinc-oxide (GZO) or the like may be used as the transparent conductive oxide.

The PR post 630 may be formed on the upper side of a channel region 631 between the thus-formed passivation films 520, and the resulting structure may further facilitate the separation process between the chips.

Figure 55:
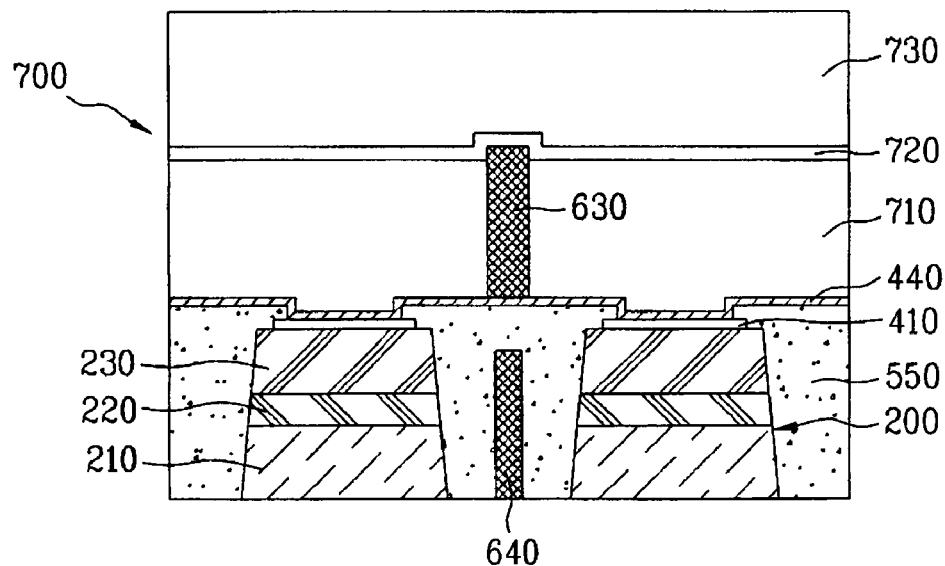
FIG. 55 is a cross-sectional view of an LED formation according to a fourth embodiment of the present invention.

FIG. 55 shows an embodiment involving first forming the PR post 640 in the trench formed between the semiconductor layers 200 and then forming the passivation layers 550.

As such, after forming the passivation layers 550, the seed metal layers and the reflective electrodes 440 may be formed. Subsequent processes are the same as described above.

Figure 56:
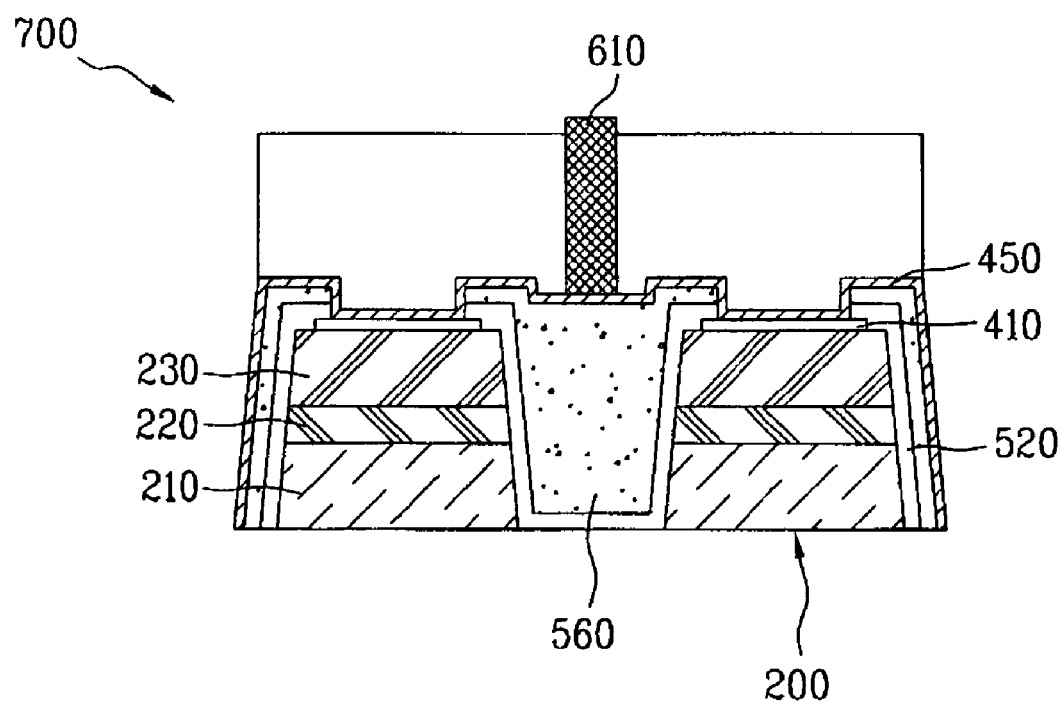
FIG. 56 is a cross-sectional view of an LED formation according to a fifth embodiment of the present invention.
Figure 57:
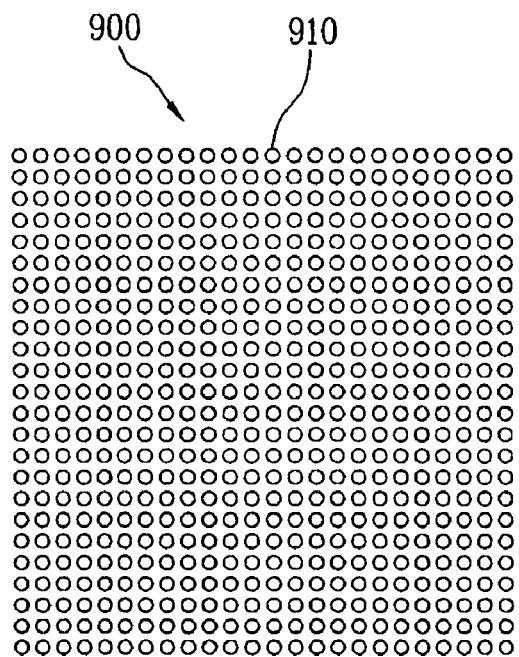
FIGS. 57 to 61 are schematic views showing examples of light-extracting structures according to various embodiments the present invention.

In addition, as shown in FIG. 56, the supporting layer 700 may be formed as a single layer. That is, the passivation films 520 may be first formed in the trench regions, and the passivation layers 560 may be formed to fill the trench regions and over the passivation films 520, thereby resulting in a double-passivation structure.

Thereafter, the seed metal layers and the reflective electrodes 450, which cover the passivation layers 560, are formed, and the PR post 610 and the supporting layer 700 made of a single layer may then be formed.

On the other hand, in the above-mentioned various structures, chip separation may be carried out by laser scribing, in addition to or in lieu of chip separation by tape expansion. That is, chip separation may be carried out by irradiating laser having a wavelength of 266 nm or 355 nm toward the trenches 300.

For laser scribing, laser may be irradiated in the direction from the supporting layer 700 to the trenches 300. In addition, laser may be irradiated toward the trenches 300 at the exposed side from which the substrate was removed. Alternatively, laser may be irradiated in both directions.

Herein, the surface of the first conductive semiconductor layer 210, exposed by the LLO process, may be protected using the PR oxide.

Upon occurrence of incomplete chip separation after laser irradiation, the chips may be separated using an additional chip breaking method.

[Supplementation of Light-Extraction Structure]

Hereinafter, a light-extraction efficiency of the above-manufactured light-emitting diode chip will be described in connection with the light-extraction structure 900.

FIGS. 57 to 61 show various examples of patterns of holes 910 constituting the light-extraction structure 900.

That is, the above-mentioned light-extraction structure 900 forms a photonic crystal (PC) structure. Examples of the photonic crystal (PC) structure may include a square lattice structure as in FIG. 57, a triangular lattice structure as in FIG. 58, an archimedean-like lattice structure as in FIG. 59, a 12-fold quasicrystal structure as in FIG. 60, and a random structure as in FIG. 61.

In connection with such a photonic crystal structure, assuming that the distance between the holes 910, i.e. a period of the photonic crystal structure, is designated as "A", the diameter of holes 910 may have a value of 0.1 A to 0.9 A, and the depth of holes 910 may have a value of 0.1 μm to up to the thickness of the first conductive semiconductor layer 210 of the GaN-based semiconductor layer 200, i.e. the thickness of the n-type semiconductor layer in the present embodiment.

Preferably, in the above photonic crystal structure, the distance between unit shapes forming the above-mentioned patterns, i.e. the holes 910, is 0.8 times the wavelength of light emitted, and the radius of holes 910 is 0.25 times the distance between the holes 910. When the photonic crystal structure is applied to a nitride-based LED, the hole-to-hole distance, i.e. a period of the photonic crystal structure, is preferably in a range of 0.5 to 2 μm.

Figure 62:
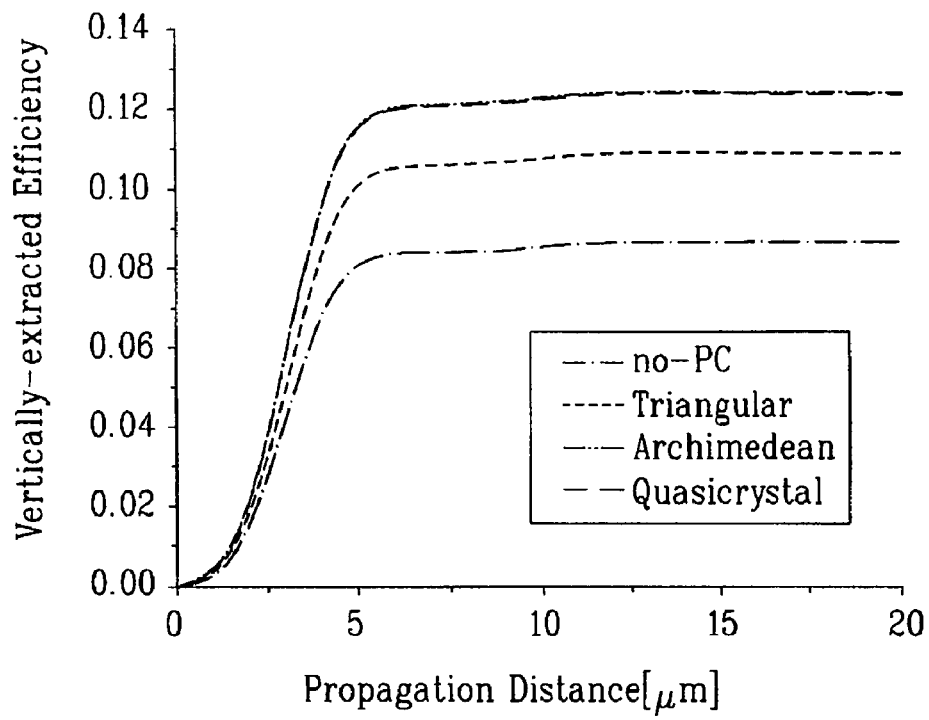
FIGS. 62 and 63 are graphs showing light-extracting efficiency with respect to different light-extracting structures.
Figure 63:
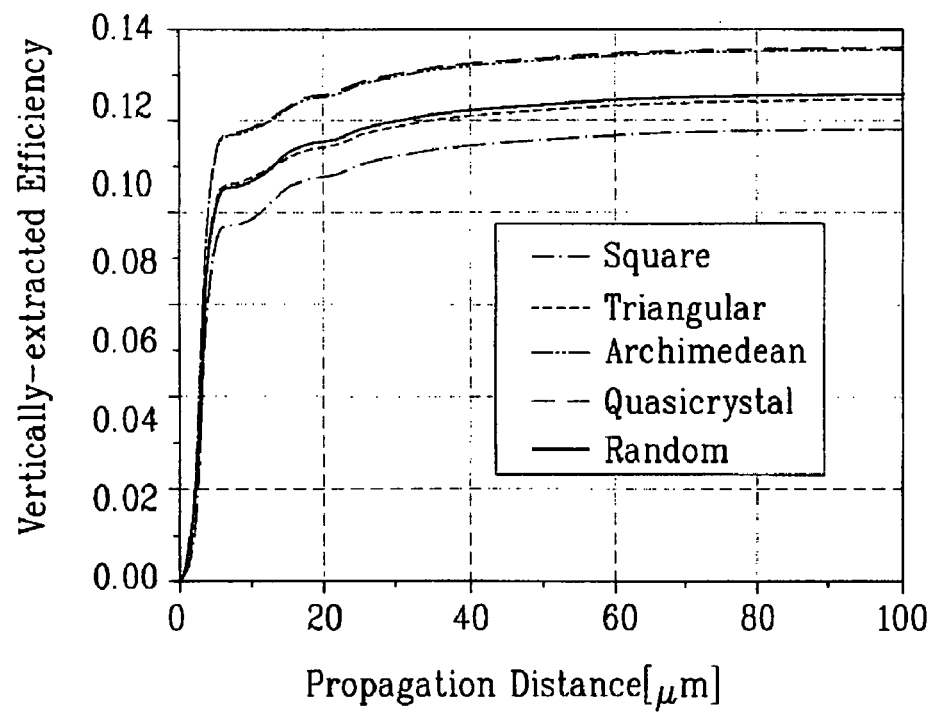

The light-extraction efficiency measured after applying each of the above photonic crystal structures to the LED of the various embodiments of the present invention are given in FIGS. 62 and 63.

Figure 58:
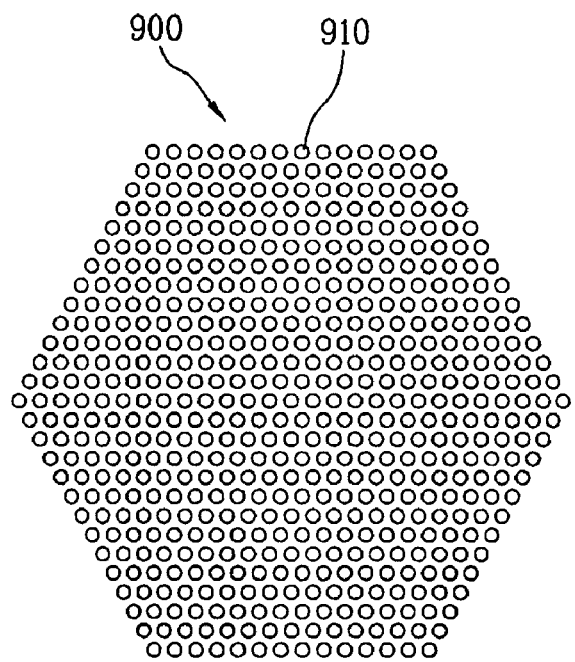
Figure 59:
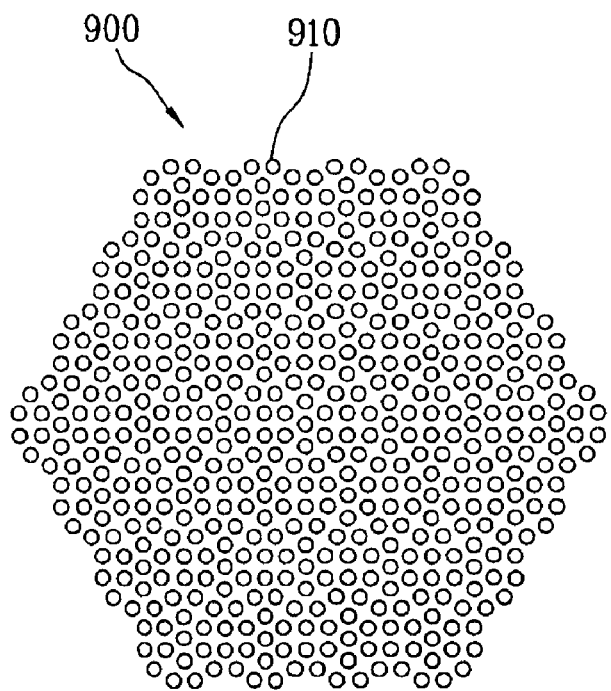
Figure 60:
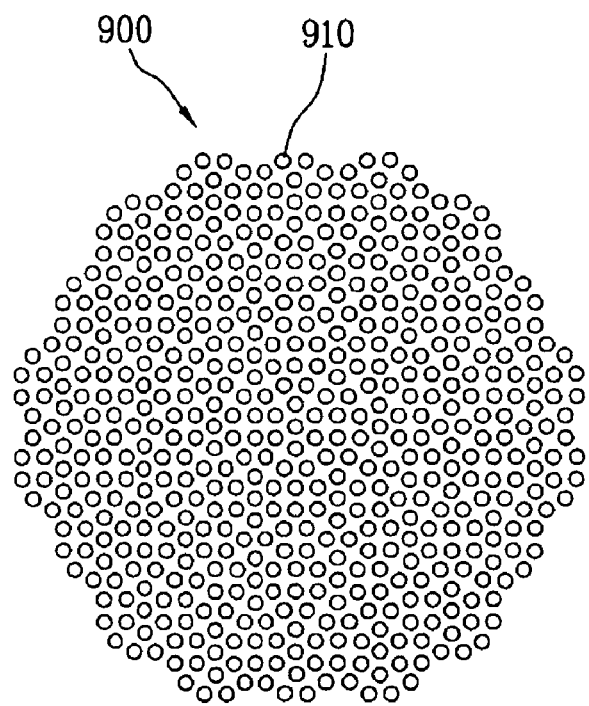
Figure 61:
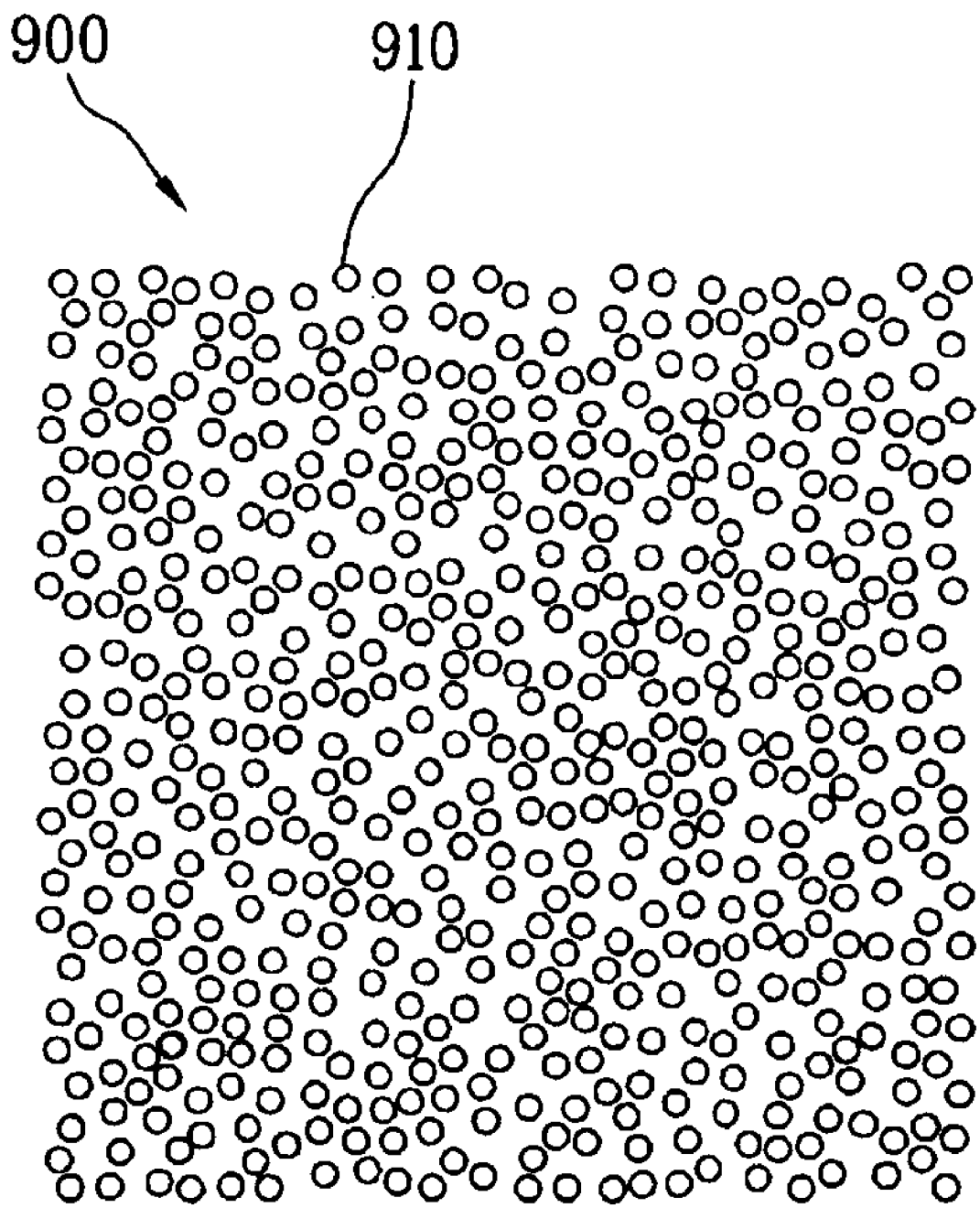

As shown in FIG. 62, it can be seen that the archimedean-like lattice structure and the quasicrystal structure exhibit an excellent light-extraction efficiency, as compared to the absence of the photonic crystal structure and the triangular lattice structure as in FIG. 58.

Further, as shown in FIG. 63, it can be seen that the archimedean-like lattice structure and the quasicrystal structure exhibit an excellent light-extraction efficiency, as compared to the square lattice structure, the triangular lattice structure and the random structure.

Therefore, concerning the light-extraction structure 900, it is advantageous to apply the archimedean-like lattice structure or the quasicrystal structure.

Figure 64:
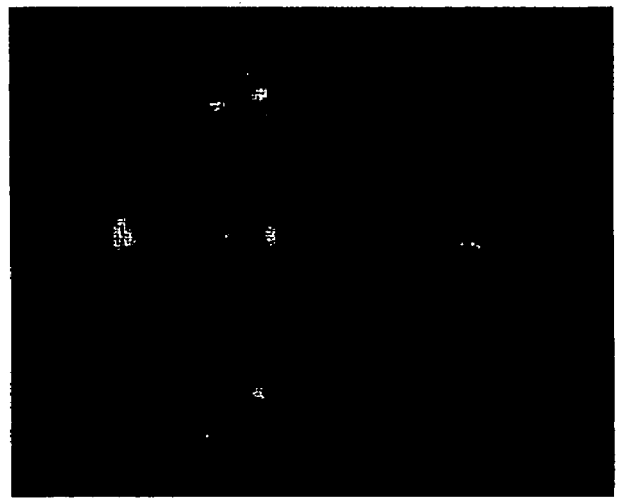
FIG. 64 is a photograph showing luminescence of a light-extracting structure having a square lattice.
Figure 65:
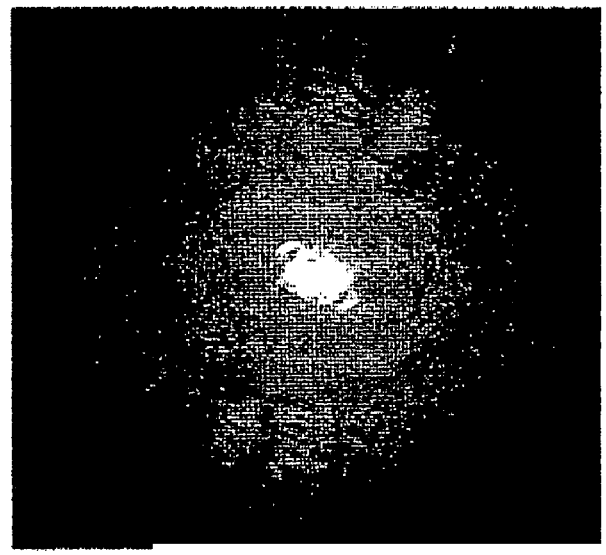
FIG. 65 is a photograph showing luminescence of a light-extracting structure having a quasicrystal lattice.

FIGS. 64 and 65 show the light-emitting surface of the LED having the photonic crystals of the square lattice structure and the LED having the quasicrystal structure.

In the case of the square lattice structure, it can be seen that several beam spots appear and an emission angle of light depends upon a viewing angle. Whereas, the quasicrystal structure shows appearance of a single beam spot and represents a Gaussian beam profile.

Figure 66:
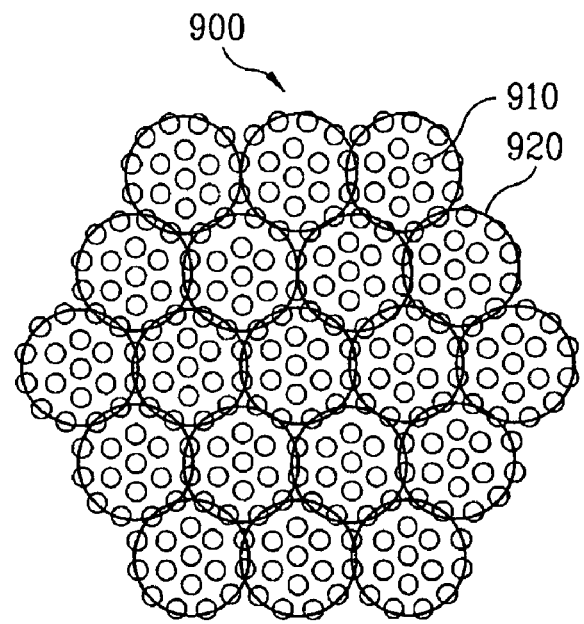
FIG. 66 is a schematic view showing a unit cell having an archimedean-like lattice.
Figure 67:
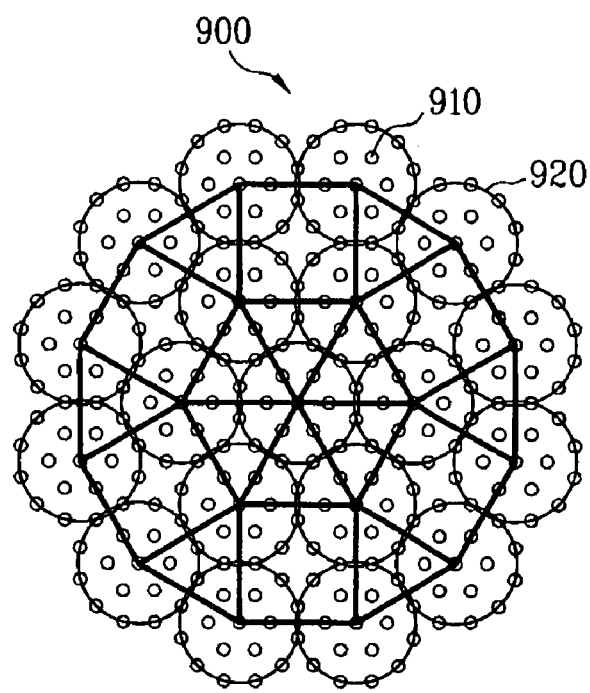
FIG. 67 is a schematic view showing a unit cell having a 12-fold quasicrystal lattice.

Characteristics of the archimedean-like lattice structure and the quasicrystal structure are shown in FIGS. 66 and 67.

Strictly speaking, the archimedean-like lattice structure shown in FIG. 66 is a kind of triangular lattice structure. However, as can be seen in FIG. 66, the archimedean-like lattice structure is different from the triangular lattice structure in that the number of holes 910 contained in a unit cell 920 constituting crystals is 19, not one.

Taking into consideration that 6 holes 910 out of 19 holes 910 in a unit cell 920 are being shared with adjacent unit cells 920, 13 holes 910 are included in the one unit cell 920.

In a broad sense, such a lattice structure maintains a hexagonal symmetry. However, such a structure simultaneously shows a dodecagonal symmetry due to the fact that 12 holes 910 are positioned in the outermost part of the unit cell 920. In addition, the archimedean-like lattice structure has a translational symmetry.

Therefore, the archimedean-like lattice structure may be favorably utilized in desired applications including LEDs, requiring isotropic properties for all incidence angles of light.

The dodecagonal quasicrystal structure as shown in FIG. 67 is similar to the archimedean-like lattice structure in that the unit cell 920 comprises of 19 holes 910, but has a difference in that a translational symmetry is not formed and each unit cell 920 is arranged while being rotated.

However, these two structures have a very similar configuration in the Fourier space, and therefore exhibit a high similarity in various characteristics associated with the diffraction of light.

The position of the holes 910 within such quasicrystals corresponds to a vertex of each unit cell when a two-dimensional plane is gradually filled with an equilateral triangle and a regular quadrilateral. As such, it is possible to realize various forms of quasicrystals, depending upon different methods of filling the two-dimensional plane with the equilateral triangle and regular quadrilateral, and kinds of unit cells that correspond to structural pieces of quasicrystals.

[Integration Electrode/Reflective Electrode]

Figure 68:
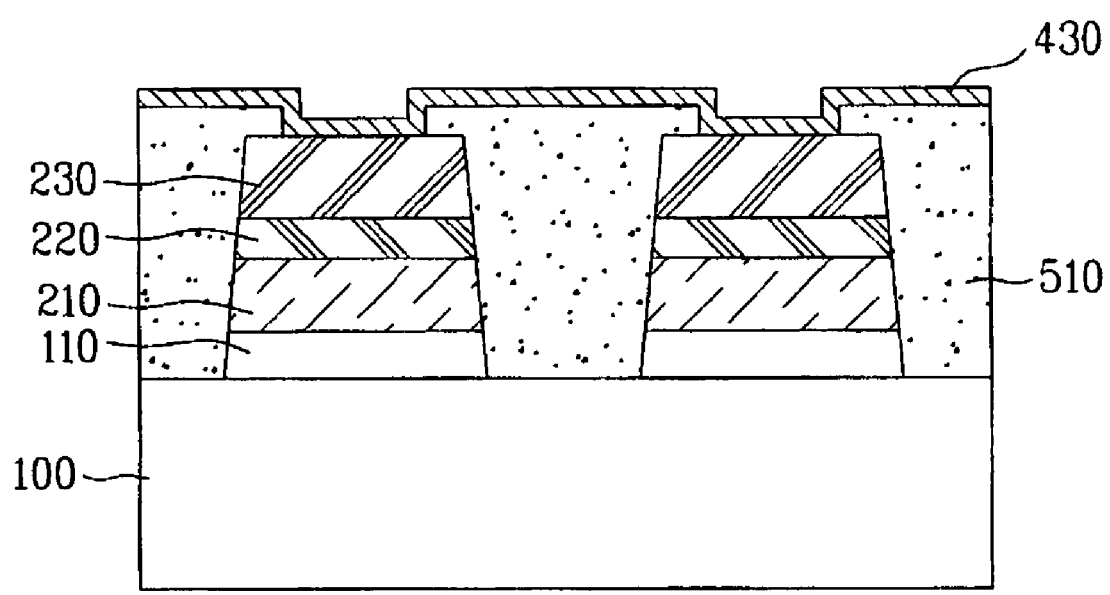
FIG. 68 is a cross-sectional view of an LED formation according to a sixth embodiment of the present invention.

Meanwhile, in the above-mentioned fabrication process, as shown in FIG. 68, one integration electrode 430 may be formed on a GaN-based semiconductor layers 200 and portions or entire portions of passivation layers 510 formed between the semiconductor layers 200.

Such an integration electrode 430 may be formed of a single metal or an alloy of various metals, may be in ohmic contact with the semiconductor layers 200, and may include functions such as an reflective electrode and a seed metal.

Utilization of such an integrated electrode 430 may result in simplification of a device structure. In addition, a supporting layer may be formed on the integrated electrode 430.

On the other hand, the reflective electrode utilized in the aforesaid various embodiments may be formed using Ag or Al, as described hereinbefore. The reflectivity with respect to a thickness of the reflective electrode will now be illustrated.

Such a reflectivity represents a reflectivity obtained when the reflective electrode is disposed between the GaN semiconductor layer and Ni.

A refractive index (n), a wave number (k) and skin depth ($\alpha^{-1}$) of the GaN semiconductor layer, Ni and the reflective electrode, i.e. Ag and Al, are given in Table 3 below. The skin depth ($\alpha^{-1}$) is a distance where an electromagnetic field can penetrate until the amplitude of the electromagnetic field is decreased to $e^{-1}$.

TABLE 3

|  | GaN | Ag | Al | Ni |
|---|---|---|---|---|
| n | 2.46 | 0.04 | 0.62 | 1.73 |
| k | 0 | 2.66 | 5.34 | 2.95 |
| $\alpha^{-1}$ |  | 13.5 nm | 6.7 nm |  |

Figure 69:
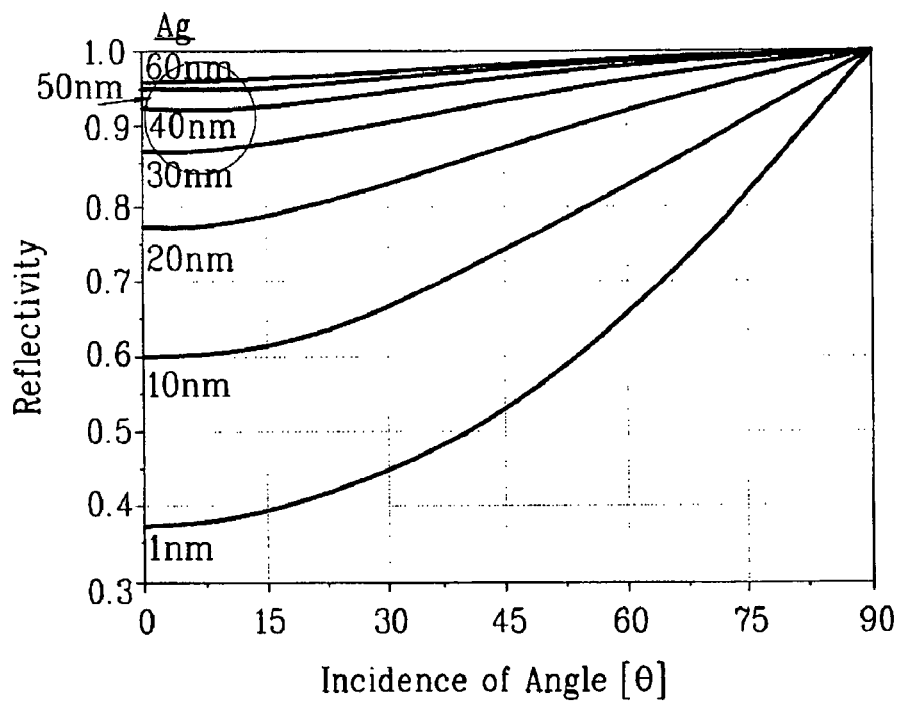
FIGS. 69 and 70 are graphs showing reflectivity with respect to a thickness of a reflective electrode according to various embodiments of the present invention.
Figure 70:
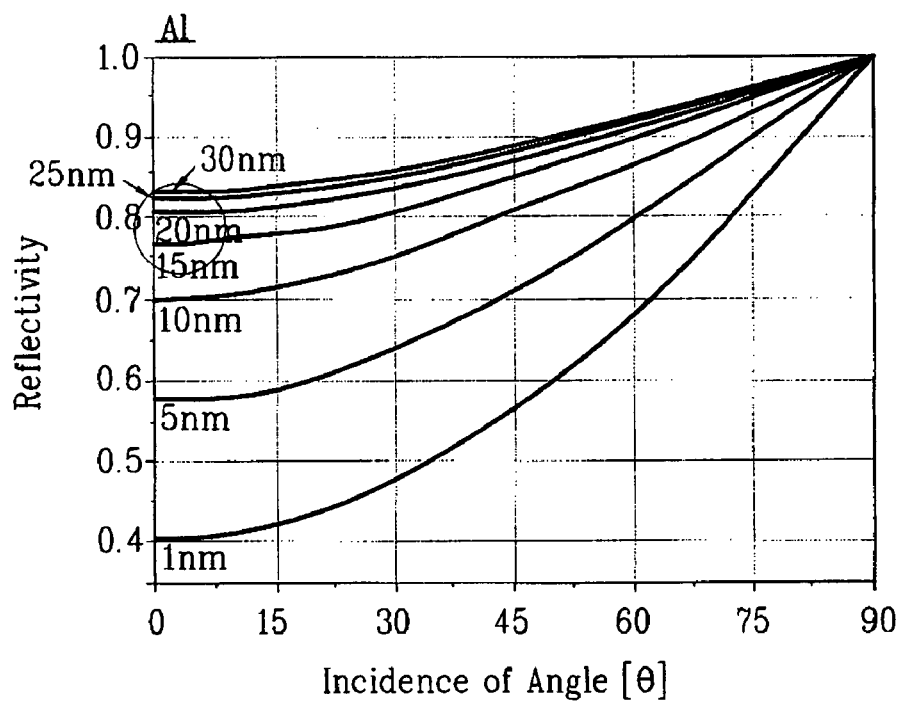

As shown in FIGS. 69 and 70, the reflectivity with respect to a thickness of the reflective electrode shows a tendency toward gradual saturation, when the electrode thickness exceeds a certain thickness.

That is, FIG. 69 shows the reflectivity for Ag, and it can be seen that the reflectivity increases by 80% or higher when the electrode thickness exceeds 30 nm (300 Å).

In addition, as shown in FIG. 70, it can be seen that the reflectivity of Al increases by about 80% or higher when the electrode thickness is greater than 15 nm (150 Å).

Upon taking into consideration the tendency of the reflectivity of the reflective electrode made of Al or Ag, the reflectivity of about 70% or higher may be obtained if the thickness of the reflective electrode is more than 100 Å.

As such, an increasing thickness of the reflective electrode provides a higher reflectivity with gradual saturation of the reflectivity. Therefore, it is enough that the thickness of the reflective electrode is more than 100 Å. Upon taking into consideration the total thickness of the LED device, the reflective electrode may have a thickness of up to about 500 nm (5000 Å). Alternatively, the reflective electrode may also be fabricated to have a thickness greater than the above range.

It will be apparent to those skilled in the art that various modifications and variations can be made without departing from the spirit or scope of the invention. Thus, it is intended that the present invention covers the modifications and variations provided they come within the scope of the appended claims and their equivalents.

What is claimed is:

1. A light emitting diode (LED) having vertical topology, comprising:
   a semiconductor structure comprising a plurality of semiconductor layers;
   a first electrode disposed on a first surface of the semiconductor structure, the first electrode comprising a reflective electrode;
   a passivation layer disposed on at least one of the first electrode and the semiconductor structure;
   a connection metal layer disposed on the first electrode;
   a second electrode on a second surface of the semiconductor structure;
   and a supporting layer disposed on the connection metal layer,
   wherein the connection metal layer comprises a first metal layer electrically connected to the first electrode, a diffusion barrier layer disposed on the first metal layer, and a second metal layer disposed on the diffusion barrier layer.

2. The LED according to claim 1, further comprising a metal layer disposed between the passivation layer and the connection metal layer.

3. The LED according to claim 1, wherein the plurality of semiconductor layers comprise:
   an n-type semiconductor layer;
   an active layer disposed on the n-type semiconductor layer; and
   a p-type semiconductor layer disposed on the active layer.

4. The LED according to claim 3, further comprising a current diffusion layer comprising an InGaN layer or an InGaN/GaN superlattice layer, on the p-type semiconductor layer.

5. The LED according to claim 1, wherein the reflective electrode comprises Ag or Al.

6. The LED according to claim 1, wherein the reflective electrode has a thickness of more than 100 Å.

7. The LED according to claim 1, wherein the reflective electrode comprises a third metal layer electrically connected to the semiconductor structure; a second diffusion barrier layer disposed on the third metal layer; and a fourth metal layer disposed on the second diffusion barrier layer.

8. The LED according to claim 7, wherein the third metal layer, the second diffusion barrier layer and the fourth metal layer are formed of a single alloy layer.

9. The LED according to claim 1, wherein the first metal layer, the diffusion barrier layer and the second metal layer are formed of a single alloy layer.

10. The LED according to claim 1, wherein the first electrode further comprises a transparent electrode.

11. The LED according to claim 1, further comprising a light-extraction structure on the second surface of the semiconductor structure.

12. The LED according to claim 11, wherein the light-extraction structure comprises a photonic crystal structure.

13. The LED according to claim 12, wherein the photonic crystal structure has a period of 0.2 to 2 μm.

14. The LED according to claim 12, wherein the photonic crystal structure comprises a pattern having a six-fold(60°) or twelve-fold(30°) rotational symmetry.

15. The LED according to claim 14, wherein the pattern comprises a unit cell having 19 holes, and wherein the unit cell shares 6 of 19 holes with adjacent unit cells.

16. The LED according to claim 15, wherein the 19 holes have a distribution having 1 hole in the center of the cell, 6 holes therearound, arranged at the same intervals, and 12 holes arranged at the same intervals around the 6 holes.

17. The LED according to claim 12, wherein the photonic crystal structure has a translational symmetry.

18. The LED according to claim 1, wherein the supporting layer comprises a side rim protion for supporting a lateral side of the semiconductor structure, via contact with the connection metal layer.

19. The LED according to claim 1, wherein the passivation layer comprises at least one of silicon dioxide ($SiO_2$), photoresist (PR), SOG and polyimide.

20. A light emitting diode (LED) having vertical topology, comprising:
   a semiconductor structure comprising a plurality of semiconductor layers;
   a first electrode disposed on a first surface of the semiconductor structure and comprising at least two layers;
   a light-extraction structure on at least a portion of a second surface of the semiconductor structure, the light-extraction structure including a first photonic crystal structure that includes randomly positioned unit structures, wherein the light-extraction structure reflects a second photonic crystal structure including periodically positioned unit structures, and wherein the distance between the periodically positioned unit structures substantially equals the average distance between the randomly positioned unit structures;
   a second electrode disposed on the second surface of the semiconductor structure; and
   a supporting layer disposed on the first electrode.

21. The LED according to claim 20, further comprising:
   a current diffusion layer between the first surface of the semiconductor structure and the first electrode.

22. The LED according to claim 20, wherein the light-extraction structure comprises a photonic crystal structure having a plurality of holes, wherein the diameter of the hole is in the range of 0.1 A to 0.9 A (where, A is the period of the photonic crystal structure), and the depth of the hole is in the range of 0.1 μm to 5 μm.

23. The LED according to claim 20, further comprising:
a current diffusion layer comprising an InGaN layer or an InGaN/GaN superlattice layer between the first surface of the semiconductor structure and the first electrode.

24. The LED according to claim 1, wherein the connection metal layer contacts the passivation layer.

25. The LED according to claim 1, wherein the first electrode is formed integrally with the connection metal layer.

26. The LED according to claim 1, wherein the connection metal layer comprises a seed metal for formation of the supporting layer or a bonding metal for attaching the supporting layer.

27. The LED according to claim 1, wherein the first electrode comprises a transparent conductive oxide layer.

28. The LED according to claim 20, further comprising a connection metal layer disposed between the first electrode and the supporting layer.

29. The LED according to claim 28, wherein the connection metal layer comprises a seed metal for formation of the supporting layer or a bonding metal for attaching the supporting layer.

30. The LED according to claim 28, wherein the first electrode is formed integrally with the connection metal layer.

31. The LED according to claim 20, wherein the supporting layer comprises a side rim portion for supporting a lateral side of the semiconductor structure.

32. The LED according to claim 20, wherein the first electrode comprises a transparent conductive oxide layer.

33. The LED according to claim 1, wherein the connection metal layer directly contacts and is disposed between the first electrode and the supporting layer.

* * * * *